(12) United States Patent
Hu et al.

(10) Patent No.: US 11,031,574 B2
(45) Date of Patent: *Jun. 8, 2021

(54) BENDABLE ELECTRONIC DEVICE MODULES, ARTICLES AND METHODS OF MAKING THE SAME

(71) Applicant: CORNING INCORPORATED, Corning, NY (US)

(72) Inventors: Guangli Hu, Berkeley Heights, NJ (US); Dhananjay Joshi, Painted Post, NY (US); Eunyoung Park, Elmira, NY (US); Yousef Kayed Qaroush, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/122,009

(22) Filed: Sep. 5, 2018

(65) Prior Publication Data

US 2019/0006619 A1 Jan. 3, 2019

Related U.S. Application Data

(62) Division of application No. 15/768,313, filed as application No. PCT/US2016/056709 on Oct. 13, 2016.

(Continued)

(51) Int. Cl.
*H01L 51/52* (2006.01)
*B32B 17/06* (2006.01)
(Continued)

(52) U.S. Cl.
CPC ........... *H01L 51/5246* (2013.01); *B32B 7/12* (2013.01); *B32B 17/00* (2013.01); *B32B 17/06* (2013.01);
(Continued)

(58) Field of Classification Search
CPC ............ H01L 51/5246; H01L 51/5281; H01L 27/323; H01L 2251/5338; G02F 1/13338;
(Continued)

(56) References Cited

U.S. PATENT DOCUMENTS 8,905,772 B2 12/2014 Rogers et al.
9,321,678 B2 4/2016 Chang et al.
(Continued)

FOREIGN PATENT DOCUMENTS

CN 104241316 A 12/2014
CN 104520337 A 4/2015
(Continued)

OTHER PUBLICATIONS

Ahead of the Curve: Samsung, LG Debut Flexible Displays, Jan. 3, 2014; 3 Pages; Electronics 360; Web-link: http://electronics360.globalspec.com/article/3922/ahead-of-the-curve-samsung-lg-debut-flexible-displays.

(Continued)

*Primary Examiner* — Anthony J Frost
(74) *Attorney, Agent, or Firm* — Jeffrey A. Schmidt

(57) ABSTRACT

A foldable electronic device module includes a glass cover element having a thickness from about 25 µm to about 200 µm, an elastic modulus from about 20 GPa to about 140 GPa and a puncture resistance of at least 1.5 kgf. The module further includes a stack with a thickness between about 100 µm and about 600 µm; and a first adhesive joining the stack to the cover element with a shear modulus between about 1 MPa and about 1 GPa. The stack further includes a panel, an electronic device, and a stack element affixed to the panel with a stack adhesive. Further, the device module is characterized by a tangential stress at a primary surface of the (Continued)

cover element of no greater than about 1000 MPa in tension upon bending the module to a radius from about 20 mm to about 2 mm.

20 Claims, 9 Drawing Sheets

Related U.S. Application Data

(60) Provisional application No. 62/290,701, filed on Feb. 3, 2016, provisional application No. 62/240,879, filed on Oct. 13, 2015.

(51) Int. Cl.
  *G02F 1/1333* (2006.01)
  *B32B 7/12* (2006.01)
  *B32B 27/36* (2006.01)
  *B32B 27/28* (2006.01)
  *B32B 27/06* (2006.01)
  *B32B 17/00* (2006.01)
  *B32B 27/34* (2006.01)
  *G02F 1/1335* (2006.01)
  *H01L 27/32* (2006.01)

(52) U.S. Cl.
  CPC ............ *B32B 27/06* (2013.01); *B32B 27/281* (2013.01); *B32B 27/34* (2013.01); *B32B 27/36* (2013.01); *G02F 1/133305* (2013.01); *G02F 1/133308* (2013.01); *B32B 2250/40* (2013.01); *B32B 2250/44* (2013.01); *B32B 2264/101* (2013.01); *B32B 2307/412* (2013.01); *B32B 2307/50* (2013.01); *B32B 2307/546* (2013.01); *B32B 2307/732* (2013.01); *B32B 2457/20* (2013.01); *C09K 2323/00* (2020.08); *C09K 2323/03* (2020.08); *G02F 1/13338* (2013.01); *G02F 1/133528* (2013.01); *G02F 2001/133331* (2013.01); *H01L 27/323* (2013.01); *H01L 51/5281* (2013.01); *H01L 2251/5338* (2013.01)

(58) Field of Classification Search
  CPC ... G02F 2001/133331; G02F 1/133308; G02F 1/133305; G02F 1/133528; G02F 1/33305; G02F 1/33308; B32B 27/34; B32B 27/36; B32B 27/281; B32B 27/06; B32B 17/00; B32B 7/12; B32B 17/06; B32B 2307/732; B32B 2307/50; B32B 2307/412; B32B 2264/101; B32B 2250/44; B32B 2250/40; B32B 2457/20; B32B 2307/546
  See application file for complete search history.

(56) References Cited

U.S. PATENT DOCUMENTS

| | | | |
|---|---|---|---|
| 9,963,374 B2 | 5/2018 | Jouanno et al. | |
| 2013/0095339 A1* | 4/2013 | Fujii | G02F 1/133308 |
| | | | 428/523 |
| 2014/0050911 A1 | 2/2014 | Mauro et al. | |
| 2014/0106141 A1* | 4/2014 | Bellman | C03C 17/34 |
| | | | 428/201 |
| 2014/0253847 A1* | 9/2014 | Saneto | G02F 1/133528 |
| | | | 349/96 |
| 2014/0367644 A1* | 12/2014 | Song | H01L 51/0097 |
| | | | 257/40 |
| 2015/0064367 A1 | 3/2015 | Choi et al. | |
| 2015/0147532 A1* | 5/2015 | Nam | G02B 26/005 |
| | | | 428/172 |
| 2015/0184031 A1* | 7/2015 | Yurt | C09J 4/06 |
| | | | 428/339 |
| 2015/0201487 A1 | 7/2015 | Kee et al. | |
| 2015/0210588 A1 | 7/2015 | Chang et al. | |
| 2015/0266272 A1 | 9/2015 | Lee et al. | |
| 2015/0364718 A1 | 12/2015 | Huang et al. | |
| 2016/0031187 A1 | 2/2016 | Zhang et al. | |

FOREIGN PATENT DOCUMENTS

| | | |
|---|---|---|
| CN | 104680941 A | 6/2015 |
| KR | 10-2002-0078976 A | 10/2002 |
| KR | 2014007252 A | 1/2014 |
| KR | 10-2014-0014951 A | 2/2014 |
| WO | 2015020952 A1 | 2/2015 |
| WO | 20151116649 A1 | 8/2015 |

OTHER PUBLICATIONS

International Search Report and Written Opinion of the International Searching Authority; PCT/US2016/056709; dated Jan. 20, 2017; 13 Pages; European Patent Office.
Kwon et al; "Mechanically and Optically Reliable Folding Structure With a Hyperelastic Material for Seamless Foldable Displays", Appl. Phys. Lett. 98, 151904 (2001) 4 Pages.
Leterrier; "Mechanics of Curvature and Strain in Flexible Organic Electronic Devices", Handbook of Flexible Organic Electronics: Materials, Manufacturing and Applications, Woodhead Publishing Series in Electronic and Optical Materials: No. 68 (2015) 34 Pages.
Loctite® Liquid Optically Clear Adhesives for Touch Panels & Displays; Loctite®; Product Selector Guide, (2012) 12 Pages.
Japanese Patent Application No. 2018-518683, Office Action dated Oct. 21, 2020, 6 pages (3 pages of English Translation and 3 pages of Original Document); Japanese Patent Office.
English Translation of CN2016800598341 Office Action dated August 13, 2020; 17 pages; Chinese Patent Office.

\* cited by examiner

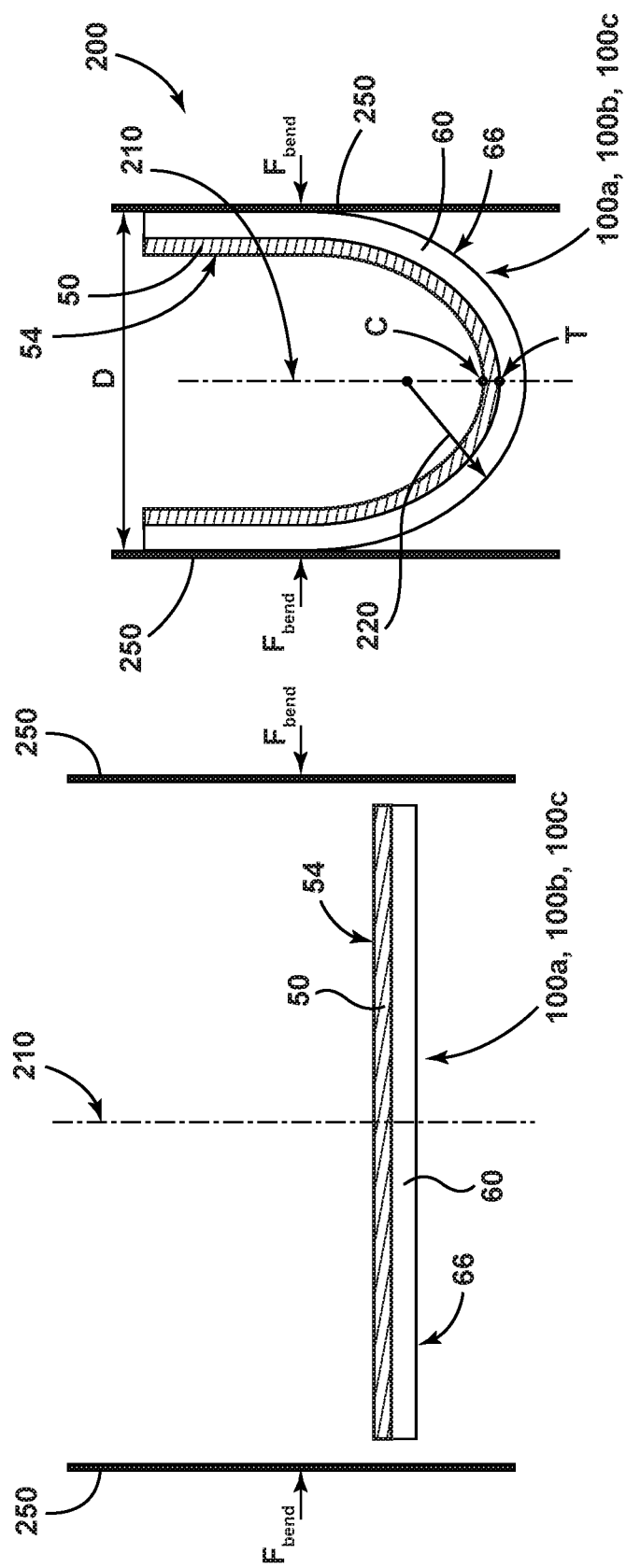

BENDABLE ELECTRONIC DEVICE MODULES, ARTICLES AND METHODS OF MAKING THE SAME

CROSS-REFERENCE TO RELATED APPLICATIONS

This application is a divisional application and claims the benefit of priority under 35 U.S.C. § 120 of U.S. application Ser. No. 15/768,313, filed on Apr. 13, 2018, which in turn, claims the benefit of priority under 35 U.S.C. § 371 of International Patent Application Serial No. PCT/US2016/056709, filed on Oct. 13, 2016 and under 35 U.S.C. § 119 of U.S. Provisional Application Ser. No. 62/290,701 filed on Feb. 3, 2016 and U.S. Provisional Application Ser. No. 62/240,879 filed on Oct. 13, 2015, the contents of each of which are relied upon and incorporated herein by reference in their entireties.

TECHNICAL FIELD

The disclosure generally relates to bendable electronic device modules, articles and methods of making them. More particularly, the disclosure relates to bendable electronic device modules having a glass-containing cover for foldable display device applications.

BACKGROUND

Flexible versions of products and components that are traditionally rigid in nature are being conceptualized for new applications. For example, flexible electronic devices can provide thin, lightweight and flexible properties that offer opportunities for new applications including curved displays and wearable devices. Many of these flexible electronic devices incorporate flexible substrates for holding and mounting the electronic components of these devices. Metal foils have some advantages including thermal stability and chemical resistance, but suffer from high cost and a lack of optical transparency. Polymeric foils have some advantages including low cost and impact resistance, but suffer from marginal optical transparency, lack of thermal stability, limited hermeticity and cyclic fatigue performance.

Some of these electronic devices also can make use of flexible displays. Optical transparency and thermal stability are often important properties for flexible display applications. In addition, flexible displays should have high fatigue and puncture resistance, including resistance to failure at small bend radii, particularly for flexible displays that have touch screen functionality and/or can be folded. Further, flexible displays should be easy to bend and fold by the consumer, depending on the intended application for the display.

Some flexible glass and glass-containing materials offer many of the needed properties for flexible and foldable substrate and display applications. However, efforts to harness glass materials for these applications have been largely unsuccessful to date. Generally, glass substrates can be manufactured to very low thickness levels (<25 µm) to achieve smaller and smaller bend radii. These "thin" glass substrates suffer from limited puncture resistance. At the same time, thicker glass substrates (>150 µm) can be fabricated with better puncture resistance, but these substrates lack suitable fatigue resistance and mechanical reliability upon bending.

Further, as these flexible glass materials are employed as cover elements in modules that also contain electronic components (e.g., thin film transistors ("TFTs"), touch sensors, etc.), additional layers (e.g., polymeric electronic device panels) and adhesives (e.g., epoxies, optically clear adhesives ("OCAs")), interactions between these various components and elements can lead to increasingly complex stress states that exist during use of the module within an end product, e.g., an electronic display device. These complex stress states can lead to increased stress levels and/or stress concentration factors experienced by the cover elements. As such, these cover elements can be susceptible to cohesive and/or delamination failure modes within the module. Further, these complex interactions can lead to increased bending forces required to bend and fold the cover element by the consumer.

Thus, there is a need for flexible, glass-containing materials and module designs that employ these materials for use in various electronic device applications, particularly for flexible electronic display device applications, and more particularly for foldable display device applications.

SUMMARY

According to a first aspect of the disclosure, a foldable electronic device module is provided that includes a cover element having a thickness from about 25 µm to about 200 µm and a cover element elastic modulus from about 20 GPa to about 140 GPa. The cover element further includes a component having a glass composition, a first primary surface, and a second primary surface. The module further includes: a stack having a thickness from about 100 µm to about 600 µm; and a first adhesive configured to join the stack to the second primary surface of the cover element, the first adhesive characterized by a shear modulus from about 0.1 MPa to about 100 MPa. The stack further includes a panel having first and second primary surfaces, and a panel elastic modulus from about 300 MPa to about 10 GPa, and an electronic device coupled to the panel. The cover element is further characterized by a puncture resistance of at least 1.5 kgf when the first primary surface of the cover element is loaded with a tungsten carbide ball having a diameter of 1.5 mm. Further, the device module is characterized by a tangential stress at the second primary surface of the cover element of no greater than about 1000 MPa in tension upon bending the module in a two-point configuration to a bend radius from about 20 mm to about 2 mm, for example from about 20 mm to about 3 mm, from about 20 mm to about 4 mm, from about 20 mm to about 5 mm, from about 20 mm to about 6 mm, from about 20 mm to about 7 mm, from about 20 mm to about 8 mm, from about 20 mm to about 9 mm, from about 20 mm to about 10 mm, from about 20 mm to about 11 mm, from about 20 mm to about 12 mm, from about 20 mm to about 13 mm, from about 20 mm to about 14 mm, from about 20 mm to about 15 mm, from about 20 mm to about 16 mm, from about 20 mm to about 17 mm, from about 20 mm to about 18 mm, from about 20 mm, to about 19 mm, from about 19 mm to about 2 mm, from about 18 mm to about 2 mm, from about 17 mm to about 2 mm, from about 16 mm to about 2 mm, from about 15 mm to about 2 mm, from about 14 mm to about 2 mm, from about 13 mm to about 2 mm, from about 12 mm to about 2 mm, from about 11 mm to about 2 mm, from about 10 mm to about 2 mm, from about 10 mm to about 3 mm, from about 9 mm to about 2 mm, from about 8 mm to about 2 mm, from about 7 mm to about 2 mm, from about 6 mm to about 2 mm, from about 5 mm to about 2 mm, from about 4 mm to about 2 mm, from about 3 mm to about 2 mm, from about 19 mm to about 3 mm, from about 18 mm to about 4 mm, from about 17 mm to about 5 mm, from about 16 mm to about 6 mm, from about 15 mm to about 7 mm, from about 14 mm to about 8 mm, from about 13 mm to about 9 mm, from about 12 mm to about 10 mm, such that the first primary surface is in compression and the bend radius is measured from a center point above the first primary surface of the cover element to the second primary surface of the panel.

According to a second aspect of the disclosure, a foldable electronic device module is provided that includes a cover element having a thickness from about 25 µm to about 200 µm and a cover element elastic modulus from about 20 GPa to about 140 GPa. The cover element further includes a component having a glass composition, a first primary surface, and a second primary surface. The module further includes: a stack having a thickness from about 100 µm to about 600 µm; and a first adhesive configured to join the stack element to the second primary surface of the cover element, the first adhesive characterized by a shear modulus from about 1 MPa to about 1 GPa. The stack further includes a panel having first and second primary surfaces, and a panel elastic modulus from about 300 MPa and about 10 GPa, an electronic device coupled to the panel, and a stack element having a stack element elastic modulus from about 1 GPa to about 5 GPa, the stack element affixed to the panel with a stack adhesive. The cover element is further characterized by a puncture resistance of at least 1.5 kgf when the first primary surface of the cover element is loaded with a tungsten carbide ball having a diameter of 1.5 mm. Further, the device module is characterized by a tangential stress at the second primary surface of the cover element of no greater than about 1000 MPa in tension upon bending the module in a two-point configuration to a bend radius from about 20 mm to about 2 mm such that the first primary surface is in compression and the bend radius is measured from a center point above the first primary surface of the cover element to the second primary surface of the panel.

In certain implementations of the foldable modules, the tangential stress at the second primary surface of the cover element is no greater than about 1000 MPa, for example, 950 MPa, 925 MPa, 900 MPa, 875 MPa, 850 MPa, 825 MPa, 800 MPa, 775 MPa, 750 MPa, 725 MPa, 700 MPa, or any amount between these tangential stress limits, upon bending the module in a two-point configuration to a bend radius from about 20 mm to about 2 mm, for example, 20 mm, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm, 3 mm, 2.75 mm, 2.5 mm, 2.25 mm and 2 mm. In certain other aspects of the foldable modules subjected to a bend radius greater than about 20 mm up to about 100 mm, the tangential stress at the second primary surface of the cover element can be substantially reduced through careful selection of the elastic modulus and/or the thickness of the adhesives in the module.

In some aspects of the foldable modules, the cover element is further characterized by no cohesive failures upon bending the module, in a two-point configuration, from an un-bent configuration to the bend radius (i.e., ranging from about 20 mm to about 2 mm, for example, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm, 3 mm, 2.75 mm, 2.5 mm, and 2.25 mm) for at least 200,000 bend cycles.

In other aspects of the foldable modules, the modules can be characterized by a bending force ($F_{bend}$) of no greater than 150 Newtons (N) as the module is bent inward or outward to a bend radius of about 3 mm. In certain implementations, the bending force is no greater than about 150 N, 140 N, 130 N, 120 N, 110 N, 100 N, 90 N, 80 N, 70 N, 60 N, 50 N, 40 N, 30 N, 20 N, 10 N, 5 N, or any amount between these bending force upper limits, upon bending of the module to a radius from about 20 mm to about 3 mm (i.e., a plate distance (D) of about 40 mm to about 6 mm), for example, 20 mm, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm and 3 mm.

According to other aspects of the foldable modules, the cover element is a glass element (e.g., the cover element includes a component having a glass composition) having a cover element elastic modulus from about 20 GPa to about 140 GPa, or any elastic modulus value between these limits, for example, 30 GPa, 35 GPa, 40 GPa, 45 GPa, 50 GPa, 55 GPa, 60 GPa, 65 GPa, 70 GPa, 75 GPa, 80 GPa, 85 GPa, 90 GPa, 95 GPa, 100 GPa, 105 GPa, 110 GPa, 115 GPa, 120 GPa, 125 GPa, 130 GPa, and 135 GPa. In other aspects, the cover element is a glass element having a cover element elastic modulus from about 20 GPa to about 120 GPa, from about 20 GPa to about 100 GPa, from about 20 GPa to about 80 GPa, from about 20 GPa to about 60 GPa, from about 20 GPa to about 40 GPa, from about 40 GPa to about 120 GPa, from about 40 GPa to about 100 GPa, from about 40 GPa to about 80 GPa, from about 40 GPa to about 60 GPa, from about 60 GPa to about 120 GPa, from about 60 GPa to about 100 GPa, from about 60 GPa to about 80 GPa, from about 80 GPa to about 120 GPa, from about 80 GPa to about 100 GPa, and from about 100 GPa to about 120 GPa. In certain implementations, the glass cover element is processed or otherwise configured with strength-enhancing measures that result in the development of one or more compressive stress regions in proximity to one or more primary surfaces of the cover element.

In certain aspects of the foldable modules, the first adhesive is characterized by a shear modulus from about 0.1 MPa to about 1 GPa, for example, from about 0.1 MPa to about 800 MPa, from about 0.1 MPa to about 600 MPa, from about 0.1 MPa to about 400 MPa, from about 0.1 MPa to about 200 MPa, from about 0.1 MPa to about 1 MPa, from about 1 MPa to about 800 MPa, from about 1 MPa to about 600 MPa, from about 1 MPa to about 400 MPa, from about 1 MPa to about 200 MPa, from about 200 MPa to about 800 MPa, from about 200 MPa to about 600 MPa, from about 200 MPa to about 400 MPa, from about 400 MPa to about 800 MPa, from about 400 MPa to about 600 MPa, and from about 600 MPa to about 800 MPa. According to an implementation of the first aspect of the foldable module, the first adhesive is characterized by a shear modulus of about 0.1 MPa, 0.2 MPa, 0.3 MPa, 0.4 MPa, 0.5 MPa, 0.6 MPa, 0.7 MPa, 0.8 MPa, 0.9 MPa, 1 MPa, 5 MPa, 10 MPa, 20 MPa, 30 MPa, 40 MPa, 50 MPa, 60 MPa, 70 MPa, 80 MPa, 90 MPa, 100 MPa, or any amount between these shear modulus values. In an implementation of the second aspect of the foldable module, the first adhesive is characterized by a shear modulus of about 1 MPa, 5 MPa, 10 MPa, 20 MPa, 30 MPa, 40 MPa, 50 MPa, 60 MPa, 70 MPa, 80 MPa, 90 MPa, 100 MPa, 200 MPa, 300 MPa, 400 MPa, 500 MPa, 600 MPa, 700 MPa, 800 MPa, 900 MPa, 1000 MPa, or any amount between these shear modulus values.

According to some embodiments of the foldable modules of the disclosure, the first adhesive is characterized by a thickness from about 5 μm to about 60 μm, for example, from about 5 μm to about 50 μm, from about 5 μm to about 40 μm, from about 5 μm to about 30 μm, from about 5 μm to about 20 μm, from about 5 μm to about 15 μm, from about 5 μm to about 10 μm, from about 10 μm to about 60 μm, from about 15 μm to about 60 μm, from about 20 μm to about 60 μm, from about 30 μm to about 60 μm, from about 40 μm to about 60 μm, from about 50 μm to about 60 μm, from about 55 μm to about 60 μm, from about 10 μm to about 50 μm, from about 10 μm to about 40 μm, from about 10 μm to about 30 μm, from about 10 μm to about 20 μm, from about 10 μm to about 15 μm, from about 20 μm to about 50 μm, from about 30 μm to about 50 μm, from about 40 μm to about 50 μm, from about 20 μm to about 40 μm, and from about 20 μm to about 30 μm. Other embodiments have a first adhesive characterized by a thickness of about 5 μm, 10 μm, 15 μm, 20 μm, 25 μm, 30 μm, 35 μm, 40 μm, 45 μm, 50 μm, 55 μm, 60 μm, or any thickness between these thickness values. In one aspect, the thickness of the first adhesive is between 10 μm and about 20 μm.

In some embodiments of the foldable modules of the disclosure, the first adhesive is further characterized by a Poisson's ratio from about 0.1 to about 0.5, for example, from about 0.1 to about 0.45, from about 0.1 to about 0.4, from about 0.1 to about 0.35, from about 0.1 to about 0.3, from about 0.1 to about 0.25, from about 0.1 to about 0.2, from about 0.1 to about 0.15, from about 0.2 to about 0.45, from about 0.2 to about 0.4, from about 0.2 to about 0.35, from about 0.2 to about 0.3, from about 0.2 to about 0.25, from about 0.25 to about 0.45, from about 0.25 to about 0.4, from about 0.25 to about 0.35, from about 0.25 to about 0.3, from about 0.3 to about 0.45, from about 0.3 to about 0.4, from about 0.3 to about 0.35, from about 0.35 to about 0.45, from about 0.35 to about 0.4, and from about 0.4 to about 0.45. Other embodiments include a first adhesive characterized by a Poisson's ratio of about 0.1, 0.15, 0.2, 0.25, 0.3, 0.35, 0.4, 0.45, 0.5, or any Poisson's ratio between these values. In one aspect, the Poisson's ratio of the first adhesive is from about 0.1 to about 0.25.

According to some implementations of the foldable modules of the second aspect of the disclosure, the stack adhesive is characterized by a shear modulus from about 10 kPa to about 100 kPa, for example, from about 10 kPa to about 90 kPa, from about 10 kPa to about 80 kPa, from about 10 kPa to about 70 kPa, from about 10 kPa to about 60 kPa, from about 10 kPa to about 50 kPa, from about 10 kPa to about 40 kPa, from about 10 kPa to about 30 kPa, from about 10 kPa to about 30 kPa, from about 20 kPa to about 90 kPa, from about 20 kPa to about 80 kPa, from about 20 kPa to about 70 kPa, from about 20 kPa to about 60 kPa, from about 20 kPa to about 50 kPa, from about 20 kPa to about 40 kPa, from about 20 kPa to about 30 kPa, from about 30 kPa to about 90 kPa, from about 30 kPa to about 80 kPa, from about 30 kPa to about 70 kPa, from about 30 kPa to about 60 kPa, from about 30 kPa to about 50 kPa, from about 30 kPa to about 40 kPa, from about 40 kPa to about 90 kPa, from about 40 kPa to about 80 kPa, from about 40 kPa to about 70 kPa, from about 40 kPa to about 60 kPa, from about 40 kPa to about 50 kPa, from about 50 kPa to about 90 kPa, from about 50 kPa to about 80 kPa, from about 50 kPa to about 70 kPa, from about 50 kPa to about 60 kPa, from about 60 kPa to about 90 kPa, from about 60 kPa to about 80 kPa, from about 60 kPa to about 70 kPa, from about 70 kPa to about 90 kPa, from about 70 kPa to about 80 kPa, and from about 80 kPa to about 90 kPa. In this aspect, the stack adhesive may also be characterized by a shear modulus of about 10 kPa, 20 kPa, 25 kPa, 30 kPa, 35 kPa, 40 kPa, 45 kPa, 50 kPa, 55 kPa, 60 kPa, 65 kPa, 70 kPa, 75 kPa, 80 kPa, 85 kPa, 90 kPa, 95 kPa, 100 kPa, or any shear modulus value between these values.

According to other implementations of the foldable modules of the second aspect of the disclosure, the stack adhesive is characterized by a thickness from about 5 μm to about 60 μm, for example from about 5 μm to about 50 μm, from about 5 μm to about 40 μm, from about 5 μm to about 30 μm, from about 5 μm to about 20 μm, from about 5 μm to about 15 μm, from about 5 μm to about 10 μm, from about 10 μm to about 60 μm, from about 15 μm to about 60 μm, from about 20 μm to about 60 μm, from about 30 μm to about 60 μm, from about 40 μm to about 60 μm, from about 50 μm to about 60 μm, from about 55 μm to about 60 μm, from about 10 μm to about 50 μm, from about 10 μm to about 40 μm, from about 10 μm to about 30 μm, from about 10 μm to about 20 μm, from about 10 μm to about 15 μm, from about 20 μm to about 50 μm, from about 30 μm to about 50 μm, from about 40 μm to about 50 μm, from about 20 μm to about 40 μm, and from about 20 μm to about 30 μm. Other embodiments have a stack adhesive characterized by a thickness of about 5 μm, 10 μm, 15 μm, 20 μm, 25 μm, 30 μm, 35 μm, 40 μm, 45 μm, 50 μm, 55 μm, 60 μm, or any thickness between these thickness values. In one aspect, the thickness of the stack adhesive is from about 30 μm to 60 μm.

According to further implementations of the foldable modules of the second aspect of the disclosure, the stack adhesive is further characterized by a Poisson's ratio from about 0.1 to about 0.5, for example, from about 0.1 to about 0.45, from about 0.1 to about 0.4, from about 0.1 to about 0.35, from about 0.1 to about 0.3, from about 0.1 to about 0.25, from about 0.1 to about 0.2, from about 0.1 to about 0.15, from about 0.2 to about 0.45, from about 0.2 to about 0.4, from about 0.2 to about 0.35, from about 0.2 to about 0.3, from about 0.2 to about 0.25, from about 0.25 to about 0.45, from about 0.25 to about 0.4, from about 0.25 to about 0.35, from about 0.25 to about 0.3, from about 0.3 to about 0.45, from about 0.3 to about 0.4, from about 0.3 to about 0.35, from about 0.35 to about 0.45, from about 0.35 to about 0.4, and from about 0.4 to about 0.45. Other embodiments include a stack adhesive characterized by a Poisson's ratio of about 0.1, 0.15, 0.2, 0.25, 0.3, 0.35, 0.4, 0.45, 0.5, or any Poisson's ratio between these values. In one aspect, the Poisson's ratio of the stack adhesive is from about 0.4 to about 0.5.

In a further implementation of the foldable module of the second aspect of the disclosure, the foldable module is configured for a display device application. As such, the stack element includes a touch sensor and a polarizer. In some embodiments, an adhesive is employed between the touch sensor and the polarizer in these configurations. Some embodiments employ a stack adhesive in these modules having a shear modulus from about 10 kPa to 100 kPa, a thickness from about 30 μm to 60 μm, and/or a Poisson's ratio from about 0.4 to about 0.5.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments. Directional terms as used herein—for example, up, down, right, left, front, back, top, bottom—are made only with reference to the figures as drawn and are not intended to imply absolute orientation.

BRIEF DESCRIPTION OF THE DRAWINGS

FIGS. 4A & 4B depict foldable electronic device modules in an un-bent and a bent configuration, respectively, within a two-point test apparatus according to an aspect of the disclosure.

DETAILED DESCRIPTION

Figure 1:
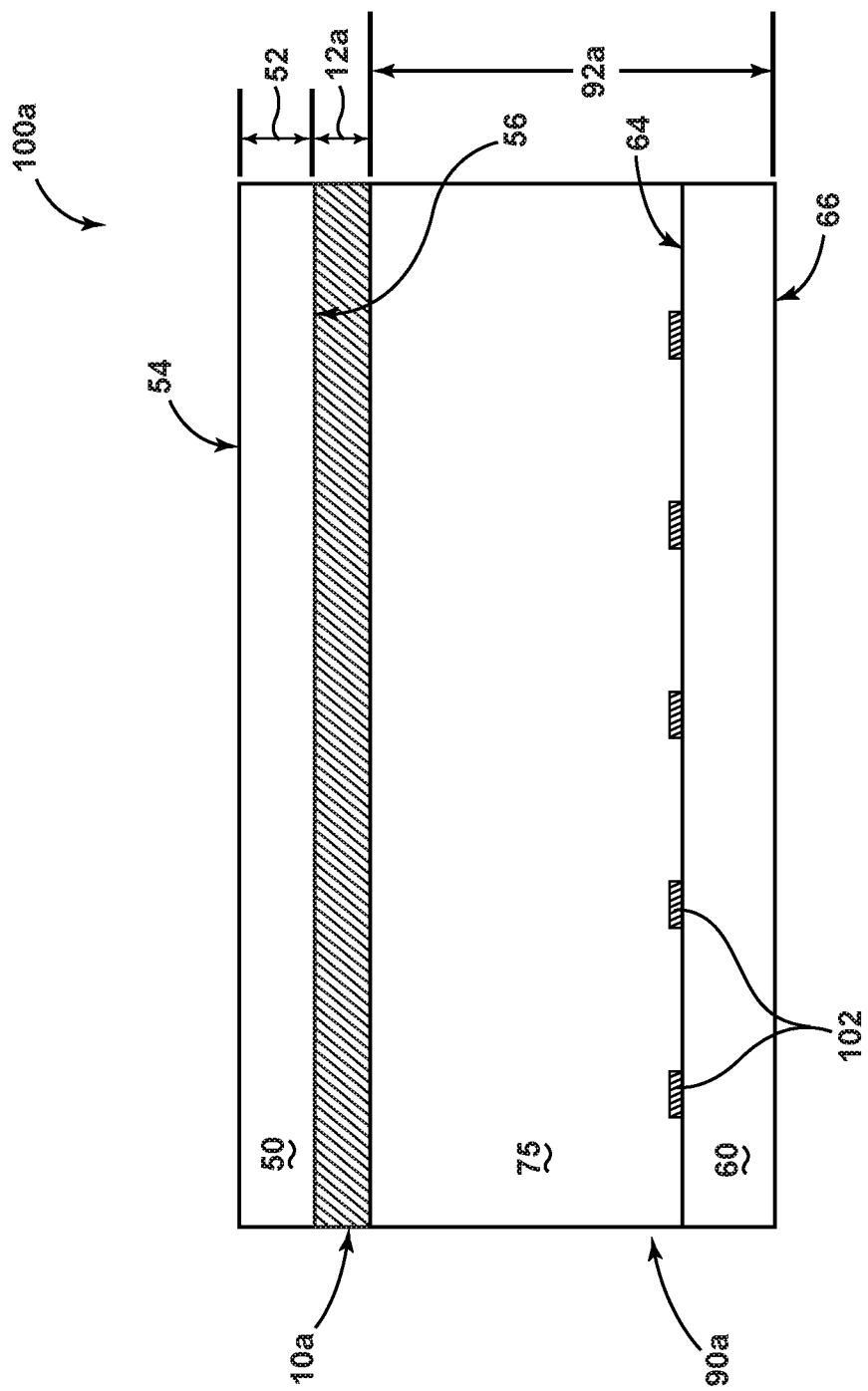
FIG. 1 is a cross-sectional view of a foldable electronic device module according to an aspect of the disclosure.

Reference will now be made in detail to embodiments according to the claims, examples of which are illustrated in the accompanying drawings. Whenever possible, the same reference numerals will be used throughout the drawings to refer to the same or like parts. Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Among other features and benefits, the bendable electronic device modules and articles (and the methods of making them) of the disclosure provide mechanical reliability at small bend radii (e.g., in static tension and fatigue) as well as high puncture resistance. Configurations of these device modules and articles are also characterized by relatively low bending forces necessary to fold or otherwise bend these device modules and articles. With regard to mechanical reliability, the bendable modules of the disclosure are configured to avoid cohesive failures in their glass-containing cover elements and delamination-related failures at interfaces between the various components within the modules (e.g., adhesive-cover element interfaces). The small bend radii and puncture resistance capabilities are beneficial when the bendable modules are used in a foldable electronic device display, for example, one wherein one part of the display is folded over on top of another portion of the display. For example, the bendable module may be used as one or more of: a cover on the user-facing portion of a foldable electronic display device, a location in which puncture resistance is particularly important; a substrate module, disposed internally within the device itself, on which electronic components are disposed; or elsewhere in a foldable electronic display device. Alternatively, the bendable modules of the disclosure may be used in a device not having a display, but one in which a glass or glass-containing layer is used for its beneficial properties and is folded or otherwise bent, in a similar manner as in a foldable display, to a tight bend radius. The puncture resistance is particularly beneficial when the bendable module is used on the exterior of the device, at a location in which a user will interact with it. Still further, the relatively low bending forces required to fold or otherwise bend certain configurations of these device modules and articles is particularly beneficial to the user when these modules and articles are employed in applications requiring manual bending (e.g., a foldable, wallet-like flexible display device).

More specifically, the foldable electronic device modules in the disclosure can obtain some or all of the foregoing advantages through control of the material properties and thicknesses of each of the adhesives employed within the modules. For example, these foldable modules can exhibit reduced tangential stresses (in tension) at primary surfaces of the cover element (e.g., a glass substrate) through reductions in the thicknesses of the adhesives employed in the modules and/or increases in the shear modulus of the adhesives employed between the cover element and the underlying stack. These lower tensile stresses at the cover element can translate into improved module reliability, bend radius capability and/or a reduced reliance upon other approaches to develop compressive stresses at the primary surfaces of the cover element (e.g., through ion exchange-driven compressive stress region development). As another example, these foldable modules can exhibit reduced tangential stresses (in tension) at the interface between the panel and an adhesive joining the panel to the stack by reducing the shear modulus of this adhesive. These lower tensile stresses can lead to improved module reliability, particular in terms of resistance to delamination between the panel and the stack. In another instance, overall module stiffness (e.g., resistance to the forces required to bend the module) can be reduced through reductions in the shear modulus of any or all of the adhesives employed in the module and/or selecting an optimum range of the thickness of any or all of the adhesives employed in the module. Moreover, the embodiments and concepts in the disclosure provide a framework for those with ordinary skill to design foldable electronic device modules to reduce tangential stresses at the cover element/stack interface, reduce tangential stresses at the panel/stack interface and reduce the resistance of the module to bending, all of which can contribute to the reliability, manufacturability and suitability of these modules for use in various applications requiring differing degrees and quantities of bending and folding evolutions.

Referring to FIG. 1, a foldable electronic device module 100a is depicted according to a first aspect of the disclosure that includes a cover element 50, first adhesive 10a, stack 90a, stack element 75, electronic devices 102 and panel 60. Cover element 50 has a thickness 52, a first primary surface 54 and a second primary surface 56. Thickness 52 can range from about 25 µm to about 200 µm, for example from about 25 µm to about 175 µm, from about 25 µm to about 150 µm, from about 25 µm to about 125 µm, from about 25 µm to about 100 µm, from about 25 µm to about 75 µm, from about 25 µm to about 50 µm, from about 50 µm to about 175 µm, from about 50 µm to about 150 µm, from about 50 µm to about 125 µm, from about 50 µm to about 100 µm, from about 50 µm to about 75 µm, from about 75 µm to about 175 µm, from about 75 µm to about 150 µm, from about 75 µm to about 125 µm, from about 75 µm to about 100 µm, from about 100 µm to about 175 µm, from about 100 µm to about 150 µm, from about 100 µm to about 125 µm, from about 125 µm to about 175 µm, from about 125 µm to about 150 µm, and from about 150 µm to about 175 µm. In other aspects, thickness 52 can range from about 25 µm to 150 µm, from about 50 µm to 100 µm, or from about 60 µm to 80 µm. The thickness 52 of the cover element 50 can also be set at other thicknesses between the foregoing ranges.

The foldable electronic device module 100a depicted in FIG. 1 includes a cover element 50 with a cover element elastic modulus from about 20 GPa to 140 GPa, for example from about 20 GPa to about 120 GPa, from about 20 GPa to about 100 GPa, from about 20 GPa to about 80 GPa, from about 20 GPa to about 60 GPa, from about 20 GPa to about 40 GPa, from about 40 GPa to about 120 GPa, from about 40 GPa to about 100 GPa, from about 40 GPa to about 80 GPa, from about 40 GPa to about 60 GPa, from about 60 GPa to about 120 GPa, from about 60 GPa to about 100 GPa, from about 60 GPa to about 80 GPa, from about 80 GPa to about 120 GPa, from about 80 GPa to about 100 GPa, and from about 100 GPa to about 120 GPa. The cover element 50 may be a component having a glass composition or include at least one component having a glass composition. In the latter case, the cover element 50 can include one or more layers that include glass-containing materials, e.g., element 50 can be a polymer/glass composite configured with second phase glass particles in a polymeric matrix. In one aspect, the cover element 50 is a glass element characterized by an elastic modulus from about 50 GPa to about 100 GPa, or any elastic modulus value between these limits. In other aspects, the cover element elastic modulus is about 20 GPa, 30 GPa, 40 GPa, 50 GPa, 60 GPa, 70 GPa, 80 GPa, 90 GPa, 100 GPa, 110 GPa, 120 GPa, 130 GPa, 140 GPa, or any elastic modulus value between these values.

Again referring to FIG. 1, the foldable module 100a further includes: a stack 90a having a thickness 92a from about 100 µm to 600 µm; and a first adhesive 10a configured to join the stack 90a to the second primary surface 56 of the cover element 50, the first adhesive 10a characterized by a thickness 12a and a shear modulus from about 0.1 MPa to about 1000 MPa, for example, from about 0.1 MPa to about 800 MPa, from about 0.1 MPa to about 600 MPa, from about 0.1 MPa to about 400 MPa, from about 0.1 MPa to about 200 MPa, from about 0.1 MPa to about 1 MPa, from about 1 MPa to about 800 MPa, from about 1 MPa to about 600 MPa, from about 1 MPa to about 400 MPa, from about 1 MPa to about 200 MPa, from about 200 MPa to about 800 MPa, from about 200 MPa to about 600 MPa, from about 200 MPa to about 400 MPa, from about 400 MPa to about 800 MPa, from about 400 MPa to about 600 MPa, and from about 600 MPa to about 800 MPa. According to an implementation of the first aspect of the foldable module 100a, the first adhesive 10a is characterized by a shear modulus of about 0.1 MPa, 0.2 MPa, 0.3 MPa, 0.4 MPa, 0.5 MPa, 0.6 MPa, 0.7 MPa, 0.8 MPa, 0.9 MPa, 1 MPa, 5 MPa, 10 MPa, 20 MPa, 30 MPa, 40 MPa, 50 MPa, 60 MPa, 70 MPa, 80 MPa, 90 MPa, 100 MPa, 200 MPa, 300 MPa, 400 MPA, 500 MPa, 600 MPa, 700 MPa, 800 MPa, 900 MPa, 1000 MPa, or any amount between these shear modulus values. Aspects of the foldable modules 100a incorporate an adhesive 10a with a relatively higher shear modulus, e.g., from about 0.1 MPa to about 100 MPa, compared to the shear modulus of conventional adhesives employed in such electronic device applications. The use of such adhesives 10a with relatively higher shear modulus values unexpectedly provides a significant decrease in tensile stresses observed at the second primary surface 56 of the cover element 50 upon bending the foldable electronic device module 100a in a direction away from the second primary surface 56—i.e., by bending the module 100a such that the second primary surface 56 exhibits a convex shape.

Still referring to FIG. 1, certain aspects of the foldable module 100a can be configured to minimize bending forces associated with bending the entire module. More particularly, the use of a first adhesive 10a with a relatively low shear modulus value (e.g., 0.01 MPa to 0.1 MPa) can unexpectedly reduce the overall bending force required to fold or otherwise bend the entire module 100a in an upward or downward direction such that the first primary surface 54 exhibits a concave or convex shape, respectively. These bending force reductions associated with certain aspects of the foldable module 100a through the use of a first adhesive 10a with a relatively low elastic shear modulus value are obtained relative to a foldable module (e.g., foldable module 100a) with an adhesive between the cover element and the stack (e.g., first adhesive 10a) having a shear modulus that exceeds 0.1 MPa.

In another embodiment of the foldable module 100a depicted in FIG. 1, the first adhesive 10a is characterized by a thickness 12a from about 5 µm to about 60 µm, for example, from about 5 µm to about 50 µm, from about 5 µm to about 40 µm, from about 5 µm to about 30 µm, from about 5 µm to about 20 µm, from about 5 µm to about 15 µm, from about 5 µm to about 10 µm, from about 10 µm to about 60 µm, from about 15 µm to about 60 µm, from about 20 µm to about 60 µm, from about 30 µm to about 60 µm, from about 40 µm to about 60 µm, from about 50 µm to about 60 µm, from about 55 µm to about 60 µm, from about 10 µm to about 50 µm, from about 10 µm to about 40 µm, from about 10 µm to about 30 µm, from about 10 µm to about 20 µm, from about 10 µm to about 15 µm, from about 20 µm to about 50 µm, from about 30 µm to about 50 µm, from about 40 µm to about 50 µm, from about 20 µm to about 40 µm, and from about 20 µm to about 30 µm. Other embodiments have a first adhesive 10a characterized by a thickness 12a of about 5 µm, 10 µm, 15 µm, 20 µm, 25 µm, 30 µm, 35 µm, 40 µm, 45 µm, 50 µm, 55 µm, 60 µm, or any thickness between these thickness values. In one aspect, the thickness 12a of the first adhesive 10a is from about 10 µm to 20 µm. Some aspects of the foldable modules 100a incorporate an adhesive 10a with a relatively lower thickness, e.g., from about 10 µm to about 20 µm, compared to the thicknesses of conventional adhesives employed in such electronic device applications. The use of such adhesives 10a with relatively lower thickness values unexpectedly provides a significant decrease in tensile stresses at the second primary surface 56 of the cover element 50 upon bending the foldable electronic device module 100a in a direction away from the second primary surface 56—i.e., by bending the module 100a such that the second primary surface 56 exhibits a convex shape. While it is believed that further decreases in the thickness 12a of the adhesive 10a will result in additional reductions in tensile stresses at the second primary surface 56 of the element 50, the thickness 12a can be limited by the bond strength for joining the element 50 to the underlying stack 90a, depending on the application requirements for the module 100a.

Still referring to FIG. 1, certain aspects of the foldable module 100a can be configured to minimize bending forces associated with bending the entire module by controlling the thickness of the first adhesive 10a. More particularly, the use of a first adhesive 10a with a range of thicknesses 12a (e.g., from about 10 µm to about 40 µm) can reduce the overall bending force required to fold or otherwise bend the entire module 100a in an upward or downward direction such that the first primary surface 54 exhibits a concave or convex shape, respectively. These bending force reductions associated with certain aspects of the foldable module 100a through the use of a first adhesive 10a within a prescribed range of thicknesses are obtained relative to a foldable module (e.g., foldable module 100a) with an adhesive between the cover element and the stack (e.g., first adhesive 10a) having a relatively small thickness (e.g. less than 10 µm) or a relatively large thickness (e.g., more than 40 µm).

In some embodiments of the foldable module 100a depicted in FIG. 1, the first adhesive 10a is further characterized by a Poisson's ratio from about 0.1 to about 0.5, for example, from about 0.1 to about 0.45, from about 0.1 to about 0.4, from about 0.1 to about 0.35, from about 0.1 to about 0.3, from about 0.1 to about 0.25, from about 0.1 to about 0.2, from about 0.1 to about 0.15, from about 0.2 to about 0.45, from about 0.2 to about 0.4, from about 0.2 to about 0.35, from about 0.2 to about 0.3, from about 0.2 to about 0.25, from about 0.25 to about 0.45, from about 0.25 to about 0.4, from about 0.25 to about 0.35, from about 0.25 to about 0.3, from about 0.3 to about 0.45, from about 0.3 to about 0.4, from about 0.3 to about 0.35, from about 0.35 to about 0.45, from about 0.35 to about 0.4, and from about 0.4 to about 0.45. Other embodiments include a first adhesive 10a characterized by a Poisson's ratio of about 0.1, 0.15, 0.2, 0.25, 0.3, 0.35, 0.4, 0.45, 0.5, or any Poisson's ratio between these values. In one aspect, the Poisson's ratio of the first adhesive 10a is from about 0.1 to about 0.25.

Referring again to FIG. 1, the stack 90a of the foldable module 100a further includes a panel 60 having first and second primary surfaces 64, 66, and a panel elastic modulus from about 300 MPa to about 10 GPa, for example, from about 300 MPa to 8000 MPa, from about 300 MPa to 6000 MPa, from about 300 MPa to 4000 MPa, from about 300 MPa to 2000 MPa, from about 300 MPa to 1000 MPa, from about 300 MPa to 500 MPa, from about 500 MPa to 8000 MPa, from about 500 MPa to 6000 MPa, from about 500 MPa to 4000 MPa, from about 500 MPa to 2000 MPa, from about 500 MPa to 1000 MPa, from about 1000 MPa to 8000 MPa, from about 1000 MPa to 6000 MPa, from about 1000 MPa to 4000 MPa, from about 1000 MPa to 2000 MPa, from about 2000 MPa to 8000 MPa, from about 2000 MPa to 6000 MPa, from about 2000 MPa to 4000 MPa, from about 4000 MPa to 8000 MPa, from about 4000 MPa to 6000 MPa, and from about 6000 MPa to 8000 MPa. The stack 90a also includes one or more electronic devices 102 coupled to the panel 60. As also depicted in FIG. 1, the stack 90a can also include a stack element 75. The stack element 75 can include various features associated with the foldable electronic device module 100a, depending on its end use application. For example, the stack element 75 may include one or more of a touch sensor, polarizer, other electronic devices, and adhesives or other compounds for joining these features to the panel 60.

In FIG. 1, the cover element 50 of the foldable module 100a is further characterized by a puncture resistance of at least 1.5 kgf when the first primary surface 54 of the cover element is loaded with a tungsten carbide ball having a diameter of 1.5 mm. Typically, puncture testing according to aspects of this disclosure is performed under displacement control at 0.5 mm/min cross-head speed. In some aspects, the cover element 50 is characterized by a puncture resistance of greater than about 1.5 kgf at a 5% or greater failure probability within a Weibull plot. The cover element 50 can also be characterized by a puncture resistance of greater than about 3 kgf at the Weibull characteristic strength (i.e., a 63.2% or greater). In certain aspects, the cover element 50 of the foldable electronic device module 100a can resist puncture at about 2 kgf or greater, 2.5 kgf or greater, 3 kgf or greater, 3.5 kgf or greater, 4 kgf or greater, and even higher ranges. The cover element 50 can also be characterized by a pencil hardness of greater than or equal to 8H.

In certain other aspects of the foldable module 100a, the cover element 50 can be characterized by a puncture resistance according to an alternative test method that employs a stainless steel pin having a flat bottom with a 200 µm diameter (rather than a tungsten carbide ball), performed under displacement control at 0.5 mm/min cross-head speed. In certain aspects, the stainless steel pin is replaced with a new pin after a specified quantity of tests (e.g., 10 tests) to avoid bias that could result from deformation of the metal pin associated with the testing of materials possessing a higher elastic modulus (e.g., cover element 50). In these aspects, the element 50 has a puncture resistance of at least 1.5 kgf when the second primary surface 56 of the element 50 is supported by (i) an approximately 25 µm thick pressure-sensitive adhesive ("PSA") having an elastic modulus from about 0.01 MPa to about 1 MPa and (ii) an approximately 50 µm thick polyethylene terephthalate layer ("PET") having an elastic modulus less than about 10 GPa, for example from about 2 GPa to about 4 GPa, and the first primary surface 54 of the element 50 is loaded with a stainless steel pin having a flat bottom with a 200 µm diameter. According to other aspects of the foldable module 100a, the cover element 50 can be characterized by a puncture resistance according to a test method that employs a tungsten carbide ball having a diameter of 1.5 mm with a PSA/PET support structure, performed under displacement control at 0.5 mm/min cross-head speed. In these aspects, the element 50 has a puncture resistance of at least 1.5 kgf when the second primary surface 56 of the element 50 is supported by (i) an approximately 25 µm thick pressure-sensitive adhesive ("PSA") having an elastic modulus from about 0.01 MPa to about 1 MPa and (ii) an approximately 50

µm thick polyethylene terephthalate layer ("PET") having an elastic modulus less than about 10 GPa, for example from about 2 GPa to about 4 GPa, and the first primary surface 54 of the element 50 is loaded with a tungsten carbide ball having a diameter of 1.5 mm. It is also believed that puncture testing according to the foregoing approaches with a stainless steel pin having a flat bottom with a 200 µm diameter will produce results consistent with employing the same approach (e.g., PSA/PET support structure) and test conditions with a tungsten carbide ball having a diameter of 1.5 mm.

Referring again to FIG. 1, the foldable electronic device module 100a, according to a first aspect of the disclosure, is characterized by a tangential stress at the second primary surface 56 of the cover element 50 of no greater than 1000 MPa in tension (i.e., at point "T," as shown in FIG. 4B) upon bending the module in a two-point configuration to a bend radius 220 (see FIG. 4B) from about 20 mm to about 2 mm such that the first primary surface 54 is in compression (i.e., at point "C," as shown in FIG. 4B) and the bend radius 220 is measured from a center point above the first primary surface 54 of the cover element 50 to the second primary surface 66 of the panel 60. In certain implementations, the tangential stress (in tension) at the second primary surface 56 of the cover element 50 is no greater than about 1000 MPa, 950 MPa, 925 MPa, 900 MPa, 875 MPa, 850 MPa, 825 MPa, 800 MPa, 775 MPa, 750 MPa, 725 MPa, 700 MPa, or any amount between these tangential stress upper limits, upon bending of the module to a radius from about 20 mm to about 2 mm in a two-point configuration, for example, 20 mm, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm, 3 mm, 2.75 mm, 2.5 mm, 2.25 mm and 2 mm, or for example from about 20 mm to about 3 mm, from about 20 mm to about 4 mm, from about 20 mm to about 5 mm, from about 20 mm to about 6 mm, from about 20 mm to about 7 mm, from about 20 mm to about 8 mm, from about 20 mm to about 9 mm, from about 20 mm to about 10 mm, from about 20 mm to about 11 mm, from about 20 mm to about 12 mm, from about 20 mm to about 13 mm, from about 20 mm to about 14 mm, from about 20 mm to about 15 mm, from about 20 mm to about 16 mm, from about 20 mm to about 17 mm, from about 20 mm to about 18 mm, from about 20 mm, to about 19 mm, from about 19 mm to about 2 mm, from about 18 mm to about 2 mm, from about 17 mm to about 2 mm, from about 16 mm to about 2 mm, from about 15 mm to about 2 mm, from about 14 mm to about 2 mm, from about 13 mm to about 2 mm, from about 12 mm to about 2 mm, from about 11 mm to about 2 mm, from about 10 mm to about 2 mm, from about 10 mm to about 3 mm, from about 9 mm to about 2 mm, from about 8 mm to about 2 mm, from about 7 mm to about 2 mm, from about 6 mm to about 2 mm, from about 5 mm to about 2 mm, from about 4 mm to about 2 mm, from about 3 mm to about 2 mm, from about 19 mm to about 3 mm, from about 18 mm to about 4 mm, from about 17 mm to about 5 mm, from about 16 mm to about 6 mm, from about 15 mm to about 7 mm, from about 14 mm to about 8 mm, from about 13 mm to about 9 mm, from about 12 mm to about 10 mm. In certain other aspects of the foldable modules subjected to a bend radius greater than about 20 mm up to about 100 mm in a two-point configuration, the tangential stress at the second primary surface of the cover element can be substantially reduced through careful selection of the elastic modulus and/or the thickness of one or more of the adhesives in the module.

Still referring to FIG. 1, the foldable electronic device module 100a, according to another implementation, can be characterized by a bending force ($F_{bend}$) of no greater than 150 Newtons (N) as the module is bent inward by a test apparatus to a bend radius 220, the bend radius being approximately half the distance (D) between two test plates 250 (see FIGS. 4A & 4B). In certain implementations, the bending force is no greater than about 150 N, 140 N, 130 N, 120 N, 110 N, 100 N, 90 N, 80 N, 70 N, 60 N, 50 N, 40 N, 30 N, 20 N, 10 N, 5 N, or any amount between these bending force upper limits, upon bending of the module to a radius from about 20 mm to about 3 mm (i.e., a plate distance (D) of about 40 to about 6 mm), for example, 20 mm, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm and 3 mm. As outlined earlier, these relatively low bending forces can be obtained in the foldable electronic device module 100a through tailoring of the material properties and/or thickness of the first adhesive 10a.

In other aspects of the foldable electronic device module 100a depicted in FIG. 1, the cover element 50 can characterized by an absence of failure when the element is held at the bend radius 220 (see FIG. 4B) from about 2 mm to 20 mm for at least 60 minutes at about 25° C. and about 50% relative humidity. As used herein, the terms "fail," "failure" and the like refer to breakage, destruction, delamination, crack propagation or other mechanisms that leave the foldable modules, assemblies and articles of this disclosure unsuitable for their intended purpose. When the cover element 50 is held at the bend radius 220 under these conditions (i.e., by virtue of a bending applied to the module 100a), bending forces are applied to the ends of the element 50. In most (if not all) aspects of the foldable electronic device modules 100a, tensile stresses are generated at the second primary surface 56 of the element 50 and compressive stresses are generated at the first primary surface 54 during the application of bending forces to the foldable module 100a such that the first primary surface 54 is bent upwards into a concave shape (see FIG. 4B). In other aspects, the bend radius 220 can be set to a range from about 5 mm to 7 mm without causing a failure in the cover element 50. Without being bound by theory, it is believed that the cover element 50 also can be characterized, in certain aspects of the disclosure, by an absence of failure when the element 50 (including the entire foldable module 100a) is held at a bend radius 220 from about 3 mm to about 10 mm for at least 120 hours at about 25° C. and about 50% relative humidity. It should also be understood that bend testing results associated with the foldable electronic device modules 100a depicted in FIG. 1 can vary under testing conditions with temperatures and/or humidity levels that differ from the foregoing test parameters.

In some aspects of the foldable module 100a, the cover element 50 is characterized by a high-cycle fatigue stress resistance. In particular, the cover element 50 can be characterized by no cohesive failures upon bending the module, in a two-point configuration, from an un-bent configuration to a constant, defined bend radius 220 (see FIGS. 4A & 4B) (i.e., ranging from 20 mm to about 2 mm) for at least 200,000 bend cycles. In other aspects, the cover element 50 is characterized by no cohesive failures upon bending the module, in a two-point configuration, from an un-bent configuration to a bend radius 220 that ranges from about 20 mm to about 2 mm for about 100,000 cycles, 110,000 cycles, 120,000 cycles, 130,000 cycles, 140,000 cycles, 150,000 cycles, 160,000 cycles, 170,000 cycles, 180,000 cycles, 190,000 cycles, 200,000 cycles, or any amount of bend cycles between these values. In certain other aspects of the foldable module 100a subjected to a bend radius 220 greater than about 20 mm up to about 100 mm, the high-cycle fatigue stress resistance of the cover element can be substantially reduced through careful selection of the elastic modulus and/or the thickness of the adhesives in the module.

In certain aspects of the foldable module 100a, the cover element 50 can include a glass layer. In other aspects, the cover element 50 can include two or more glass layers. As such, the thickness 52 reflects the sum of the thicknesses of the individual glass layers making up the cover element 50. In those aspects in which the cover element 50 includes two or more individual glass layers, the thickness of each of the individual glass layers is no less than 1 µm. For example, the cover element 50 employed in the module 100a can include three glass layers, each having a thickness of about 8 µm, such that the thickness 52 of the cover element 50 is about 24 µm. It should also be understood, however, that the cover element 50 could include other non-glass layers (e.g., compliant polymer layers) sandwiched between multiple glass layers. In other implementations of the module 100a, the cover element 50 can include one or more layers that include glass-containing materials, e.g., element 50 can be a polymer/glass composite configured with second phase glass particles in a polymeric matrix.

In FIG. 1, a foldable electronic device module 100a including a cover element 50 comprising a glass material can be fabricated from alkali-free aluminosilicate, borosilicate, boroaluminosilicate, and silicate glass compositions. The cover element 50 can also be fabricated from alkali-containing aluminosilicate, borosilicate, boroaluminosilicate, and silicate glass compositions. In certain aspects, alkaline earth modifiers can be added to any of the foregoing compositions for the cover element 50. In one exemplary aspect, glass compositions according to the following are suitable for a cover element 50 having one or more glass layers: $SiO_2$ at 64 to 69% (by mol %); $Al_2O_3$ at 5 to 12%; $B_2O_3$ at 8 to 23%; MgO at 0.5 to 2.5%; CaO at 1 to 9%; SrO at 0 to 5%; BaO at 0 to 5%; $SnO_2$ at 0.1 to 0.4%; $ZrO_2$ at 0 to 0.1%; and $Na_2O$ at 0 to 1%. In another exemplary aspect, the following composition is suitable for the glass layer 50a: $SiO_2$ at ~67.4% (by mol %); $Al_2O_3$ at ~12.7%; $B_2O_3$ at ~3.7%; MgO at ~2.4%; CaO at 0%; SrO at 0%; $SnO_2$ at ~0.1%; and $Na_2O$ at ~13.7%. In a further exemplary aspect, the following composition is also suitable for a glass layer employed in the cover element 50: $SiO_2$ at 68.9% (by mol %); $Al_2O_3$ at 10.3%; $Na_2O$ at 15.2%; MgO at 5.4%; and $SnO_2$ at 0.2%. Various criteria can be used to select the composition for a cover element 50 comprising a glass material, including but not limited to ease of manufacturing to low thickness levels while minimizing the incorporation of flaws; ease of development of a compressive stress region to offset tensile stresses generated during bending, optical transparency; and corrosion resistance.

The cover element 50 employed in the foldable module 100a can adopt a variety of physical forms and shapes. From a cross-sectional perspective, the element 50, as a single layer or multiple layers, can be flat or planar. In other aspects, the element 50 can be fabricated in non-rectilinear, sheet-like forms depending on the final application. As an example, a mobile display device having an elliptical display and bezel could employ a cover element 50 having a generally elliptical, sheet-like form.

Still referring to FIG. 1, the cover element 50 of the foldable electronic device module 100a can, in certain aspects of the disclosure, comprise a glass layer or component with one or more compressive stress regions (not shown) that extend from the first and/or second primary surfaces 54, 56 to a selected depth in the cover element 50. Further, in certain aspects of the module 100a, edge compressive stress regions (not shown) that extend from edges of the element 50 (e.g., as normal or substantially normal to primary surfaces 54, 56) to a selected depth can also be developed. For example, the compressive stress region or regions (and/or edge compressive stress regions) contained in a glass cover element 50 can be formed with an ion-exchange ("IOX") process. As another example, a glass cover element 50 can comprise various tailored glass layers and/or regions that can be employed to develop one or more such compressive stress regions through a mismatch in coefficients of thermal expansion ("CTE") associated with the layers and/or regions.

In those aspects of the device module 100a with a cover element 50 having one or more compressive stress regions formed with an IOX process, the compressive stress region(s) can include a plurality of ion-exchangeable metal ions and a plurality of ion-exchanged metal ions, the ion-exchanged metal ions selected so as to produce compressive stress in the compressive stress region(s). In some aspects of the module 100a containing compressive stress region(s), the ion-exchanged metal ions have an atomic radius larger than the atomic radius of the ion-exchangeable metal ions. The ion-exchangeable ions (e.g., $Na^+$ ions) are present in the glass cover element 50 before being subjected to the ion exchange process. Ion-exchanging ions (e.g., $K^+$ ions) can be incorporated into the glass cover element 50, replacing some of the ion-exchangeable ions within region(s) within the element 50 that ultimately become the compressive stress region(s). The incorporation of ion-exchanging ions, for example, $K^+$ ions, into the cover element 50 can be effected by submersing the element 50 (e.g., prior to formation of the complete module 100a) in a molten salt bath containing ion-exchanging ions (e.g., molten $KNO_3$ salt). In this example, the $K^+$ ions have a larger atomic radius than the $Na^+$ ions and tend to generate local compressive stress in the glass cover element 50 wherever present, e.g., in the compressive stress region(s).

Depending on the ion-exchanging process conditions employed for the cover element 50 employed in the foldable electronic device module 100a depicted in FIG. 1, the ion-exchanging ions can be imparted from the first primary surface 54 of the cover element 50 down to a first ion exchange depth (not shown), establishing an ion exchange depth-of-layer ("DOL"). Similarly, a second compressive stress region can be developed in the element 50 from the second primary surface 56 down to a second ion exchange depth. Compressive stress levels within the DOL that far exceed 100 MPa can be achieved with such IOX processes, up to as high as 2000 MPa. The compressive stress levels in the compressive stress region(s) within the cover element 50 can serve to offset tensile stresses generated in the cover element 50 upon bending of the foldable electronic device module 100a.

Referring again to FIG. 1, the foldable electronic device module 100a can, in some implementations, include one or more edge compressive stress regions in the cover element 50 at edges that are normal to the first and second primary surfaces 54, 56, each defined by a compressive stress of at least 100 MPa. It should be understood that such edge compressive stress regions can be developed in the cover element 50 at any of its edges or surfaces distinct from its primary surfaces, depending on the shape or form of element 50. For example, in an implementation of foldable module 100a having an elliptical-shaped cover element 50, edge compressive stress regions can be developed inward from the outer edge of the element that is normal (or substantially normal) from the primary surfaces of the element. IOX processes that are similar in nature to those employed to generate the compressive stress region(s) in proximity to the primary surfaces 54, 56 can be deployed to produce these edge compressive stress regions. More specifically, any such edge compressive stress regions in the cover element 50 can be used to offset tensile stresses generated at the edges of the element through, for example, bending of the cover element 50 (and module 100a) across any of its edges and/or non-uniform bending of the cover element 50 at its primary surfaces 54, 46. Alternatively, or as an addition thereto, without being bound by theory, any such edge compressive stress regions employed in the cover element 50 may offset adverse effects from an impact or abrasion event at or to the edges of the element 50 within the module 100a.

Referring again to FIG. 1, in those aspects of the device module 100a with a cover element 50 having one or more compressive stress regions formed through a mismatch in CTE of regions or layers within the element 50, these compressive stress regions are developed by tailoring of the structure of the element 50. For example, CTE differences within the element 50 can produce one or more compressive stress regions within the element. In one example, the cover element 50 can comprise a core region or layer that is sandwiched by clad regions or layers, each substantially parallel to the primary surfaces 54, 56 of the element. Further, the core layer is tailored to a CTE that is greater than the CTE of the clad regions or layers (e.g., by compositional control of the core and clad layers or regions). After the cover element 50 is cooled from its fabrication processes, the CTE differences between the core region or layer and the clad regions or layers cause uneven volumetric contraction upon cooling, leading to the development of residual stress in the cover element 50 manifested in the development of compressive stress regions below the primary surfaces 54, 56 within the clad region or layers. Put another way, the core region or layer and the clad regions or layers are brought into intimate contact with one another at high temperatures; and these layers or regions are then cooled to a low temperature such that the greater volume change of the high CTE core region (or layer) relative to the low CTE clad regions (or layers) creates the compressive stress regions in the clad regions or layers within the cover element 50.

Still referring to the cover element 50 in the module 100a that is depicted in FIG. 1 with CTE-developed compressive stress regions, the CTE-related compressive stress regions reach from the first primary surface 54 down to a first CTE region depth and the second primary surface 56 to a second CTE region depth, respectively, thus establishing CTE-related DOLs for each of the compressive stress regions associated with the respective primary surfaces 54, 56 and within the clad layer or regions. In some aspects, the compressive stress levels in these compressive stress regions can exceed 150 MPa. Maximizing the difference in CTE values between the core region (or layer) and the clad regions (or layers) can increase the magnitude of the compressive stress developed in the compressive stress regions upon cooling of the element 50 after fabrication. In certain implementations of the foldable electronic device module 100a with a cover element 50 having such CTE-related compressive stress regions, the cover element 50 employs a core region and clad regions with a thickness ratio of greater than or equal to 3 for the core region thickness divided by the sum of the clad region thicknesses. As such, maximizing the size of the core region and/or its CTE relative to the size and/or CTE of the clad regions can serve to increase the magnitude of the compressive stress levels observed in the compressive stress regions of the foldable module 100a.

Among other advantages, the compressive stress regions (e.g., as developed through the IOX- or CTE-related approaches outlined in the foregoing paragraphs) can be employed within the cover element 50 to offset tensile stresses generated in the element upon bending of the foldable module 100a, particularly tensile stresses that reach a maximum on one of the primary surfaces 54, 56, depending on the direction of the bend. In certain aspects, the compressive stress region can include a compressive stress of at least about 100 MPa at the primary surfaces 54, 56 of the cover element 50. In some aspects, the compressive stress at the primary surfaces is from about 600 MPa to about 1000 MPa. In other aspects, the compressive stress can exceed 1000 MPa at the primary surfaces, up to 2000 MPa, depending on the process employed to produce the compressive stress in the cover element 50. The compressive stress can also range from about 100 MPa to about 600 MPa at the primary surfaces of the element 50 in other aspects of this disclosure. In additional aspect, the compressive stress region (or regions) within the cover element 50 of the module 100a can exhibit a compressive stress from about 100 MPa to about 2000 MPa, for example, from about 100 MPa to about 1500 MPa, from about 100 MPa to about 1000 MPa, from about 100 MPa to about 800 MPa, from about 100 MPa to about 600 MPa, from about 100 MPa to about 400 MPa, from about 100 MPa to about 200 MPa, from about 200 MPa to about 1500 MPa, from about 200 MPa to about 1000 MPa, from about 200 MPa to about 800 MPa, from about 200 MPa to about 600 MPa, from about 200 MPa to about 400 MPa, from about 400 MPa to about 1500 MPa, from about 400 MPa to about 1000 MPa, from about 400 MPa to about 800 MPa, from about 400 MPa to about 600 MPa, from about 600 MPa to about 1500 MPa, from about 600 MPa to about 1000 MPa, from about 600 MPa to about 800 MPa, from about 800 MPa to about 1500 MPa, from about 800 MPa to about 1000 MPa, and from about 1000 MPa to about 1500 MPa.

Within such a compressive stress region employed in the cover element 50 of a foldable electronic device module 100a, the compressive stress can stay constant, decrease or increase as a function of depth from the primary surfaces down to one or more selected depths. As such, various compressive stress profiles can be employed in the compressive stress region. Further, the depth of each of the compressive stress regions can be set at approximately 15 µm or less from the primary surfaces 54, 56 of the cover element 50. In other aspects, the depth of the compressive stress region(s) can be set such that they are approximately ⅓ of the thickness 52 of the cover element 50 or less, or 20% of the thickness 52 of the cover element 50 or less, from the first and/or second primary surfaces 54, 56.

Referring again to FIG. 1, the foldable electronic device module 100a can include a cover element 50 comprising a glass material having one or more compressive stress regions with a maximum flaw size of 5 µm or less at the first and/or second primary surfaces 54, 56. The maximum flaw size can also be held to about 2.5 µm or less, 2 µm or less, 1.5 µm or less, 0.5 µm or less, 0.4 µm or less, or even smaller flaw size ranges. Reducing the flaw size in the compressive stress region of a glass cover element 50 can further reduce the propensity of the element 50 to fail by crack propagation upon the application of tensile stresses by virtue of bending forces to the foldable module 100a (see FIG. 4B). In addition, some aspects of the foldable device module 100a can include a surface region with a controlled flaw size distribution (e.g., flaw sizes of 0.5 µm or less at the first and/or second primary surfaces 54, 56) without employing one or more compressive stress regions.

Referring to FIGS. 1 and 4A, bending forces, $F_{bend}$, applied to the foldable electronic device module 100a can result in tensile stresses at the second primary surface 56 of the cover element 50, e.g. at point "T" shown in FIG. 4A. Tighter (i.e., smaller) bending radii 220 lead to higher tensile stresses. Further, tighter bending radii 220 also require increasingly higher bending forces, $F_{bend}$, to bend or otherwise fold the module 100a to the desired radii 220. Equation (1) below can be used to estimate the maximum tensile stresses in the cover element 50, particularly at the second primary surface 56 of the cover element 50, subjected to bending with a constant bend radius 220. Equation (1) is given by:

$$\sigma_{max} = \frac{E}{1-v^2}\frac{h}{2}\frac{1}{R} \quad (1)$$

where E is the Young's modulus of the glass cover element 50, v is the Poisson's ratio of the cover element 50 (typically v is ~0.2-0.3 for most glass compositions), h is reflective of the thickness 52 of the cover element, and R is the bend radius of curvature (comparable to bend radius 220). Using Equation (1), it is apparent that maximum bending stresses are linearly dependent on the thickness 52 of the glass cover element 50 and elastic modulus, and inversely dependent on the bend radius 220 of curvature of the glass cover element 50.

The bending forces, $F_{bend}$, applied to the foldable module 100a and, particularly the cover element 50, could also result in the potential for crack propagation leading to instantaneous or slower, fatigue failure mechanisms within the element 50. The presence of flaws at the second primary surface 56, or just beneath the surface, of the element 50 can contribute to these potential failure modes. Using Equation (2) below, it is possible to estimate the stress intensity factor in a glass cover element 50 subjected to bending forces, $F_{bend}$. Equation (2) is given by:

$$K = Y\sigma\sqrt{\pi a} = \frac{YE}{1-v^2}\frac{h}{2}\frac{1}{R}\sqrt{\pi a} \quad (2)$$

where a is the flaw size, Y is a geometry factor (generally assumed to be 1.12 for cracks emanating from a glass edge, a typical failure mode), and σ is the bending stress associated with the bending forces, $F_{bend}$, as estimated using Equation (1). Equation (2) assumes that the stress along the crack face is constant, which is a reasonable assumption when the flaw size is small (e.g., <1 µm). When the stress intensity factor K reaches the fracture toughness of the glass cover element 50, $K_{IC}$, instantaneous failure will occur. For most compositions suitable for use in glass cover element 50, $K_{IC}$ is ~0.7 MPa√m. Similarly, when K reaches a level at or above a fatigue threshold, $K_{threshold}$, failure can also occur via slow, cyclic fatigue loading conditions. A reasonable assumption for $K_{threshold}$ is ~0.2 MPa√m. However, $K_{threshold}$ can be experimentally determined and is dependent upon the overall application requirements (e.g., a higher fatigue life for a given application can increase $K_{threshold}$). In view of Equation (2), the stress intensity factor can be reduced by reducing the overall tensile stress level and/or the flaw size at the primary surfaces of the glass cover element 50, particularly at those surfaces likely subject to high tensile stresses upon bending.

According to some aspects of foldable electronic device module 100a, the tensile stress and stress intensity factor estimated through Equations (1) and (2) can be minimized through the control of the stress distribution at the second primary surface 56 of the glass cover element 50. In particular, a compressive stress profile (e.g., through one or more of the CTE- or IOX-related compressive stress regions outlined in the foregoing paragraphs) at and below the second primary surface 56 is subtracted from the bending stress calculated in Equation (1). As such, overall bending stress levels are beneficially reduced which, in turn, also reduces the stress intensity factors that can be estimated through Equation (2).

Again referring to FIG. 1, other implementations of the foldable electronic device module 100a can include a cover element 50 comprising a glass material subjected to various etching processes that are tailored to reduce the flaw sizes and/or improve the flaw distribution within the element 50. These etching processes can be employed to control the flaw distributions within the cover element 50 in close proximity to its primary surfaces 54, 56, and/or along its edges (not shown). For example, an etching solution containing about 15 vol % HF and 15 vol % HCl can be employed to lightly etch the surfaces of a cover element 50 having a glass composition. The time and temperature of the light etching can be set, as understood by those with ordinary skill, according to the composition of the element 50 and the desired level of material removal from the surfaces of the cover element 50. It should also be understood that some surfaces of the element 50 can be left in an un-etched state by employing masking layers or the like to such surfaces during the etching procedure. More particularly, this light etching can beneficially improve the strength of the cover element 50. In particular, cutting or singling processes employed to section the glass structure that is ultimately employed as the cover element 50 can leave flaws and other defects within the surfaces of the element 50. These flaws and defects can propagate and cause glass breakage during the application of stresses to the module 100a containing the element 50 from the application environment and usage. The selective etching process, by virtue of lightly etching one or more edges of the element 50, can remove at least some of the flaws and defects, thereby increasing the strength and/or fracture resistance of the lightly-etched surfaces, e.g., as demonstrated in the foregoing paragraphs in view of Equation (1) and (2).

It should also be understood that the cover element 50 employed in the foldable module 100a depicted in FIG. 1 can include any one or more of the foregoing strength-enhancing features: (a) IOX-related compressive stress regions; (b) CTE-related compressive stress regions; and (c) etched surfaces with smaller defect sizes. These strength-enhancing features can be used to offset or partially offset tensile stresses generated at the surfaces of the cover element 50 associated with the application environment, usage and processing of the foldable electronic device module 100a.

As outlined above, the foldable electronic device module 100a depicted in FIG. 1 includes an adhesive 10a with certain material properties (e.g., a shear modulus from about 0.1 MPa to 100 MPa). Example adhesives that can be employed as the adhesive 10a in the module 100a include optically clear adhesives ("OCAs") (e.g., Henkel Corporation LOCTITE® liquid OCAs), epoxies, and other joining materials as understood by those with ordinary skill in the field that are suitable to join the stack 90a to the second primary surface 56 of the cover element 50. In some aspects of the module 100a, the adhesive 10a will also possess a high thermal resistance such that its material properties experience little to no change upon being subjected to various temperatures (e.g., 500 hours at −40° C. and about +85° C.), humidity and high temperature (e.g., 500 hours at +65° C. at 95% R.H.), and temperature gradients (e.g., 200 thermal shock cycles, each cycle given by one hour at −40° C. followed one hour at +85° C.) in the application environment, including those generated by friction from bending of the foldable electronic device module 100a. Further, the adhesive 10a may have high resistance to ultraviolet light exposure and high peel adhesion properties comparable to those exhibited by 3M Company 8211, 8212, 8213, 8214 and 8215 OCAs.

As also outlined above, the foldable electronic device module 100a depicted in FIG. 1 includes a panel 60 having a panel elastic modulus from about 300 MPa to about 10 GPa, for example, from 300 MPa to about 5000 MPa, from 300 MPa to about 2500 MPa, from 300 MPa to about 1000 MPa, from 300 MPa to about 750 MPa, from 300 MPa to about 500 MPa, from 500 MPa to about 5000 MPa, from 500 MPa to about 2500 MPa, from 500 MPa to about 1000 MPa, from 500 MPa to about 750 MPa, from 750 MPa to about 5000 MPa, from 750 MPa to about 2500 MPa, from 750 MPa to about 1000 MPa, from 1000 MPa to about 5000 MPa, from 1000 MPa to about 2500 MPa, and from 2500 MPa to about 5000 MPa. In some aspects, the panel elastic modulus of the panel 60 is about 350 MPa, 400 MPa, 450 MPa, 500 MPa, 550 MPa, 600 MPa, 650 MPa, 700 MPa, 750 MPa, 800 MPa, 850 MPa, 900 MPa, 950 MPa, 1000 MPa, 2 GPa, 3 GPa, 4 GPa, 5 GPa, 6 GPa, 7 GPa, 8 GPa, 9 GPa, 10 GPa, or any elastic modulus value between these values. Suitable materials that can be employed as the panel 60 in the module 100a include various thermoset and thermoplastic materials, e.g., polyimides, suitable for mounting electronic devices 102 and possessing high mechanical integrity and flexibility when subjected to the bending associated with the foldable electronic device module 100a. For example, panel 60 may be an organic light emitting diode ("OLED") display panel. The material selected for the panel 60 may also exhibit a high thermal stability to resist material property changes and/or degradation associated with the application environment for the module 100a and/or its processing conditions.

In some implementations, the foldable electronic device module 100a depicted in FIG. 1 can be employed in a display, printed circuit board, housing or other features associated with an end product electronic device. For example, the foldable module 100a can be employed in an electronic display device containing numerous thin film transistors ("TFTs") or in an LCD or OLED device containing a low-temperature polysilicon ("LTPS") backplane. When the foldable module 100a is employed in a display, for example, the module 100a can be substantially transparent. Further, the module 100a can have pencil hardness, bend radius, puncture resistance and/or optimized bending force capabilities as described in the foregoing paragraphs. In one exemplary implementation, the foldable electronic device module 100a is employed in a wearable electronic device, for example, a watch, wallet or bracelet. As defined herein, "foldable" includes complete folding, partial folding, bending, flexing, discrete bends, and multiple-fold capabilities.

Figure 2:
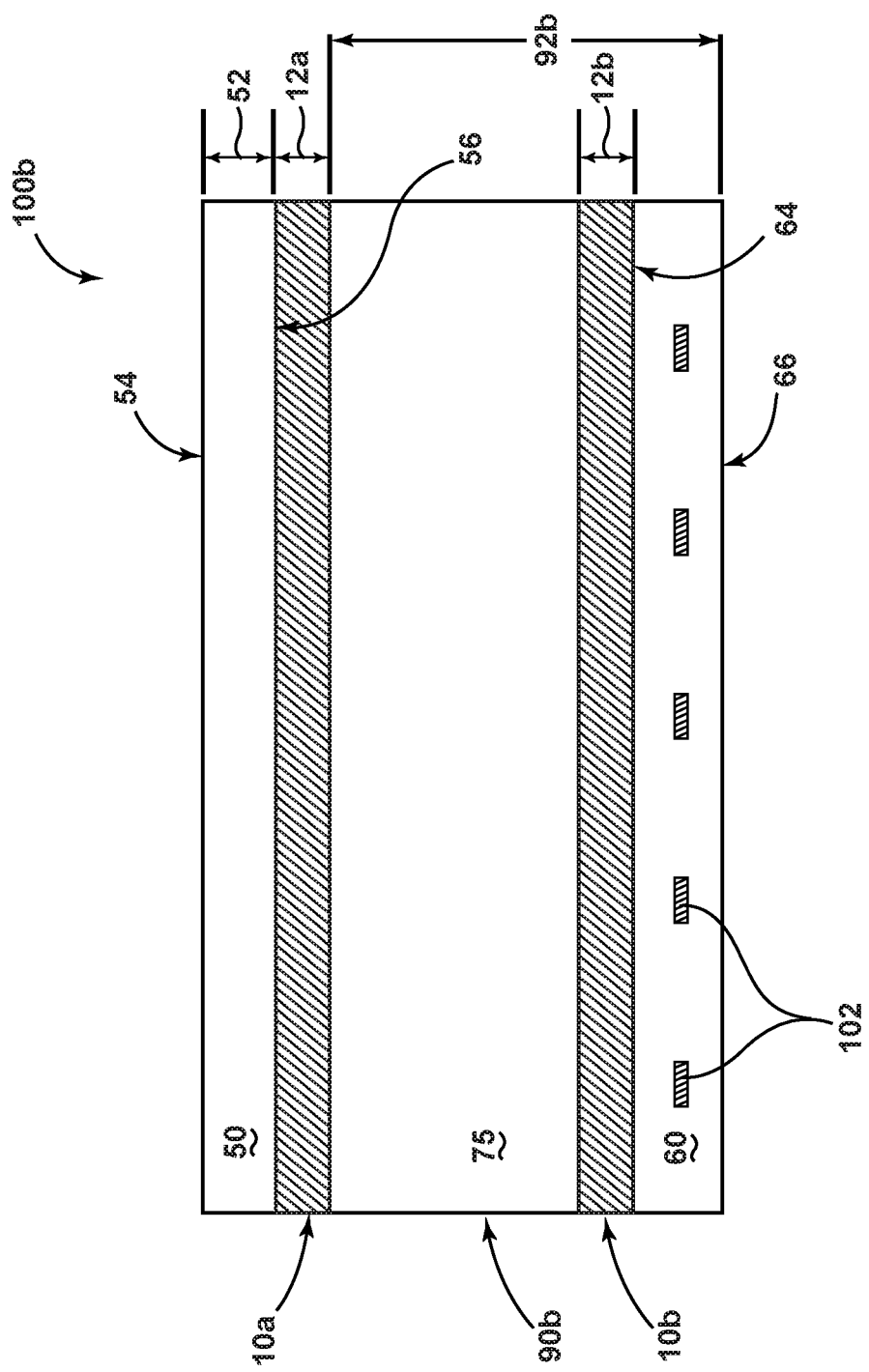
FIG. 2 is a cross-sectional view of a foldable electronic device module according to a further aspect of the disclosure.

Referring now to FIG. 2, a foldable electronic device module 100b is provided with many features in common with the foldable electronic device module 100a (see FIG. 1). Unless otherwise noted, any features in common between the modules 100a and 100b (i.e., with the same element numbers) have the same or similar construction, features and properties. As shown in FIG. 2, the module 100b includes a cover element 50 having a thickness from about 25 μm to about 200 μm and a cover element elastic modulus from about 20 GPa to about 140 GPa. The cover element 50 further includes a glass composition or a component having a glass composition, a first primary surface 54, and a second primary surface 56.

The module 100b depicted in FIG. 2 further includes: a stack 90b having a thickness 92b from about 100 μm to about 600 μm; and a first adhesive 10a configured to join the stack element 75 to the second primary surface 56 of the cover element 50. In the module 100b, the first adhesive 10a is characterized by a shear modulus between about 1 MPa and about 1 GPa, for example, from about 0.1 MPa to about 800 MPa, from about 0.1 MPa to about 600 MPa, from about 0.1 MPa to about 400 MPa, from about 0.1 MPa to about 200 MPa, from about 0.1 MPa to about 1 MPa, from about 1 MPa to about 800 MPa, from about 1 MPa to about 600 MPa, from about 1 MPa to about 400 MPa, from about 1 MPa to about 200 MPa, from about 200 MPa to about 800 MPa, from about 200 MPa to about 600 MPa, from about 200 MPa to about 400 MPa, from about 400 MPa to about 800 MPa, from about 400 MPa to about 600 MPa, and from about 600 MPa to about 800 MPa. In some aspects of the module 100b, the first adhesive 10a is characterized by a shear modulus of 0.1 MPa, 0.2 MPa, 0.3 MPa, 0.4 MPa, 0.5 MPa, 0.6 MPa, 0.7 MPa, 0.8 MPa, 0.9 MPa, 1 MPa, 5 MPa, 10 MPa, 20 MPa, 30 MPa, 40 MPa, 50 MPa, 60 MPa, 70 MPa, 80 MPa, 90 MPa, 100 MPa, 200 MPa, 300 MPa, 400 MPa, 500 MPa, 600 MPa, 700 MPa, 800 MPa, 900 MPa, 1000 MPa, or any amount between these shear modulus values. Aspects of the foldable module 100b incorporate an adhesive 10a with a relatively higher shear modulus, e.g., from about 1 MPa to about 1000 MPa (i.e., 1 GPa), compared to the shear modulus of conventional adhesives typically employed in such electronic device applications. The use of such adhesives 10a with relatively higher shear modulus values unexpectedly provides a significant decrease in tensile stresses observed at the second primary surface 56 of the cover element 50 upon bending the foldable electronic device module 100b in a direction away from the second primary surface 56—i.e., by bending the module 100b such that the second primary surface 56 exhibits a convex shape.

Still referring to FIG. 2, certain aspects of the foldable module 100b can be configured to minimize bending forces associated with bending the entire module by controlling the shear modulus of one or more of the adhesives employed within the module 100b. More particularly, the use of a first adhesive 10a with a relatively low shear modulus value (e.g., from about 0.01 MPa to about 0.1 MPa) can reduce the overall bending force required to fold or otherwise bend the entire module 100b in an upward or downward direction such that the first primary surface 54 exhibits a concave or convex shape, respectively. These bending force reductions associated with certain aspects of the foldable module 100b through the use of a first adhesive 10a with a relatively low elastic shear modulus value are obtained relative to a foldable module (e.g., foldable module 100b) with an adhesive between the cover element and the stack (e.g., first adhesive 10a) having a shear modulus that exceeds 0.1 MPa.

Figure 3:
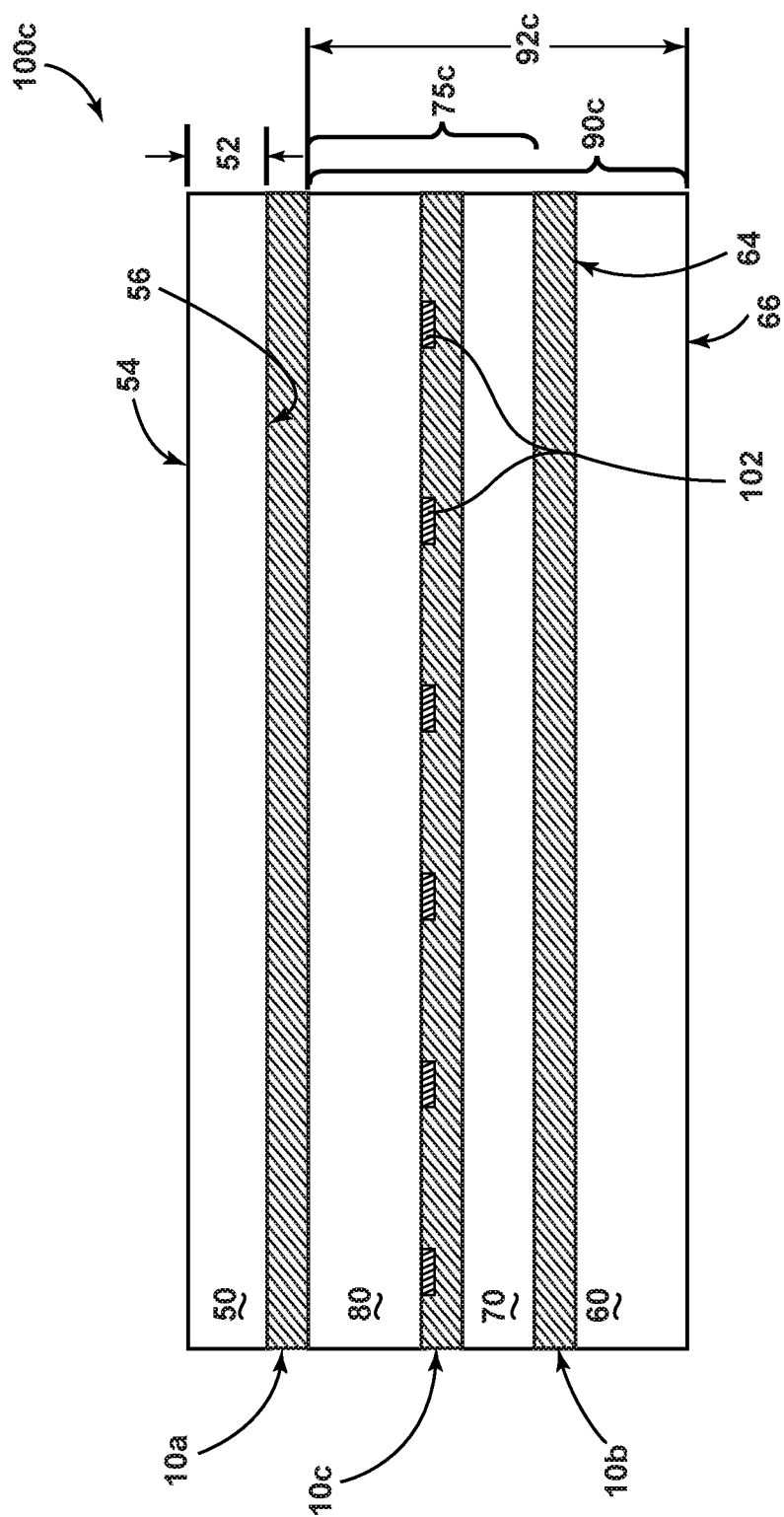
FIG. 3 is a cross-sectional view of a foldable electronic device module according to an additional aspect of the disclosure.

Referring again to the foldable electronic device module 100b depicted in FIG. 2, the stack 90b further includes a panel 60 having first and second primary surfaces 64, 66, and a panel elastic modulus from about 300 MPa to 10 GPa. The stack 90b also includes one or more electronic devices 102 coupled to or within the panel 60, and a stack element 75 having a stack element elastic modulus from about 1 GPa to about 5 GPa, with the stack element being affixed to the panel 60 with a stack adhesive 10b. As outlined earlier in connection with the module 100a (see FIG. 1), the stack element 75 can include various components, including but not limited to a touch sensor, polarizer, touch sensor components (e.g., electrode layers), thin film transistors, driving circuits, sources, drains, doped regions, and other electronic device and electronic device components, other adhesives, and joining materials. Collectively, these features possess an elastic modulus between about 1 GPa and about 10 GPa within the foldable electronic device module 100b. It should also be understood that the relationship between the panel 60, stack element 75 and electronic devices 102 (e.g., as located within the panel 60) is depicted schematically in FIG. 2. Depending on the application for the device module 100b, these elements may have different orientations with regard to one another. For example, panel 60 can be an LCD panel or an OLED display in which the electronic devices 102 are sandwiched within the panel 60 (e.g., as shown schematically in FIG. 2) by two glass layers (not shown), or a polymeric substrate encapsulated by a glass sealing layer, for instance. In another example, as schematically shown in FIG. 3 and discussed further below, the electronic devices 102 can be aspects of a touch sensor (e.g., electronic trace lines in a transparent conductor such as indium tin oxide, silver nanowires, etc.) located at a higher vertical position within the stack 75, above the panel 60 and stack adhesive 10b.

With regard to the stack adhesive 10b employed in the foldable electronic device module 100b, its composition can be selected to join the stack element 75 to the panel 60 with a bond strength suitable for the application employing the module 100b. According to some implementations of the foldable modules 100b of the second aspect of the disclosure, the stack adhesive 10b is characterized by a shear modulus from about 10 kPa to about 100 kPa, for example, from about 10 kPa to about 90 kPa, from about 10 kPa to about 80 kPa, from about 10 kPa to about 70 kPa, from about 10 kPa to about 60 kPa, from about 10 kPa to about 50 kPa, from about 10 kPa to about 40 kPa, from about 10 kPa to about 30 kPa, from about 10 kPa to about 30 kPa, from about 20 kPa to about 90 kPa, from about 20 kPa to about 80 kPa, from about 20 kPa to about 70 kPa, from about 20 kPa to about 60 kPa, from about 20 kPa to about 50 kPa, from about 20 kPa to about 40 kPa, from about 20 kPa to about 30 kPa, from about 30 kPa to about 90 kPa, from about 30 kPa to about 80 kPa, from about 30 kPa to about 70 kPa, from about 30 kPa to about 60 kPa, from about 30 kPa to about 50 kPa, from about 30 kPa to about 40 kPa, from about 40 kPa to about 90 kPa, from about 40 kPa to about 80 kPa, from about 40 kPa to about 70 kPa, from about 40 kPa to about 60 kPa, from about 40 kPa to about 50 kPa, from about 50 kPa to about 90 kPa, from about 50 kPa to about 80 kPa, from about 50 kPa to about 70 kPa, from about 50 kPa to about 60 kPa, from about 60 kPa to about 90 kPa, from about 60 kPa to about 80 kPa, from about 60 kPa to about 70 kPa, from about 70 kPa to about 90 kPa, from about 70 kPa to about 80 kPa, and from about 80 kPa to about 90 kPa. In this aspect, the stack adhesive 10b may also be characterized by a shear modulus of about 10 kPa, 20 kPa, 25 kPa, 30 kPa, 35 kPa, 40 kPa, 45 kPa, 50 kPa, 55 kPa, 60 kPa, 65 kPa, 70 kPa, 75 kPa, 80 kPa, 85 kPa, 90 kPa, 95 kPa, 100 kPa, or any shear modulus value between these values. Aspects of the foldable modules 100b incorporate a stack adhesive 10b with a relatively lower shear modulus, e.g., from about 10 kPa to about 100 kPa, compared to the shear modulus of conventional adhesives typically employed in such electronic device applications. The use of such adhesives 10b with relatively lower shear modulus values unexpectedly provides a significant decrease in tensile stresses observed at the first primary surface 64 of the panel 60 upon bending the foldable electronic device module 100b in a direction away from the second primary surface 66—i.e., by bending the module 100b such that the second primary surface 66 exhibits a convex shape.

Referring again to FIG. 2, certain aspects of the foldable module 100b can be configured to minimize bending forces associated with bending the entire module by controlling the shear modulus of one or more of the adhesives employed within the module 100b. For example, the use of stack adhesive 10b with a relatively low shear modulus value (e.g., from about 0.01 MPa to about 0.1 MPa) can unexpectedly reduce the overall bending force required to fold or otherwise bend the entire module 100b in an upward or downward direction such that the first primary surface 54 exhibits a concave or convex shape, respectively. Moreover, other aspects of the foldable module 100b can be configured to minimize bending forces associated with bending the entire module by controlling the shear modulus of the first adhesive 10a and the shear modulus of the stack adhesive 10b (e.g., both adhesives having a shear modulus from about 0.01 MPa to about 0.1 MPa). These bending force reductions associated with certain aspects of the foldable module 100b through the use of a first adhesive 10a and/or a stack adhesive 10b with a relatively low elastic shear modulus value are obtained relative to a foldable module (e.g., foldable module 100b) with one or more adhesives (e.g., adhesives 10a, 10b) having a shear modulus that exceeds 0.1 MPa.

According to other implementations of the foldable modules 100b (see FIG. 2) of the second aspect of the disclosure, the stack adhesive 10b is characterized by a thickness 12b from about 5 µm to about 60 µm, for example, from about 5 µm to about 50 µm, from about 5 µm to about 40 µm, from about 5 µm to about 30 µm, from about 5 µm to about 20 µm, from about 5 µm to about 15 µm, from about 5 µm to about 10 µm, from about 10 µm to about 60 µm, from about 15 µm to about 60 µm, from about 20 µm to about 60 µm, from about 30 µm to about 60 µm, from about 40 µm to about 60 µm, from about 50 µm to about 60 µm, from about 55 µm to about 60 µm, from about 10 µm to about 50 µm, from about 10 µm to about 40 µm, from about 10 µm to about 30 µm, from about 10 µm to about 20 µm, from about 10 µm to about 15 µm, from about 20 µm to about 50 µm, from about 30 µm to about 50 µm, from about 40 µm to about 50 µm, from about 20 µm to about 40 µm, and from about 20 µm to about 30 µm. Other embodiments have a stack adhesive 10b characterized by a thickness 12b of about 5 µm, 10 µm, 15 µm, 20 µm, 25 µm, 30 µm, 35 µm, 40 µm, 45 µm, 50 µm, 55 µm, 60 µm, or any thickness between these thickness values. In one aspect, the thickness 12b of the stack adhesive 10b is from about 30 µm to about 60 µm. The use of such adhesives 10*b* with relatively higher thickness values unexpectedly provides a significant decrease in tensile stresses observed at the first primary surface 64 of the panel 60 upon bending the foldable electronic device module 100*b* in a direction away from the second primary surface 66 of the panel. While it is believed that further increases in the thickness 12*b* of the adhesive 10*b* will result in additional reductions in tensile stresses observed at the first primary surface 64 of the panel 60, the thickness 12*b* can be limited by application requirements aimed at minimizing the overall thickness 92*b* of the stack 90*b*.

Still referring to FIG. 2, certain aspects of the foldable module 100*b* can be configured to minimize bending forces associated with bending the entire module by controlling the thickness of the first adhesive 10*a* and/or the stack adhesive 10*b*. More particularly, the use of a first adhesive 10*a* with a range of thicknesses 12*a* (e.g., from about 10 µm to about 40 µm) and/or the stack adhesive 10*b* with a range of thicknesses 12*b* (e.g., from about 10 µm to 40 µm) can reduce the overall bending force required to fold or otherwise bend the entire module 100*b* in an upward or downward direction such that the first primary surface 54 exhibits a concave or convex shape, respectively. These bending force reductions associated with certain aspects of the foldable module 100*b* through the use of a first adhesive 10*a* and/or a stack adhesive 10*b* within a prescribed range of thicknesses are obtained relative to a foldable module (e.g., foldable module 100*b*) with one or more adhesives (e.g., first adhesive 10*a* and/or a stack adhesive 10*b*) having a relatively small thickness (e.g. less than 10 µm) or a relatively large thickness (e.g., more than 40 µm).

Referring again to FIG. 2, the foldable electronic device module 100*b*, according to another implementation, can be characterized by a bending force ($F_{bend}$) of no greater than 150 Newtons (N) as the module is bent inward by a test apparatus to a bend radius 220, the bend radius being approximately half the distance (D) between two test plates 250 (see FIGS. 4A & 4B). In certain implementations, the bending force is no greater than about 150 N, 140 N, 130 N, 120 N, 110 N, 100 N, 90 N, 80 N, 70 N, 60 N, 50 N, 40 N, 30 N, 20 N, 10 N, 5 N, or any amount between these bending force upper limits, upon bending of the module to a radius from about 20 mm to about 3 mm (i.e., a plate distance (D) of about 40 to about 6 mm), for example, 20 mm, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm and 3 mm. As outlined earlier, these relatively low bending forces can be obtained in the foldable electronic device module 100*b* through tailoring of the material properties and/or thicknesses of the first adhesive 10*a* and/or the stack adhesive 10*b*.

In some embodiments of the foldable module 100*b* depicted in FIG. 2, the stack adhesive 10*b* is further characterized by a Poisson's ratio from about 0.1 to about 0.5, for example, from about 0.1 to about 0.45, from about 0.1 to about 0.4, from about 0.1 to about 0.35, from about 0.1 to about 0.3, from about 0.1 to about 0.25, from about 0.1 to about 0.2, from about 0.1 to about 0.15, from about 0.2 to about 0.45, from about 0.2 to about 0.4, from about 0.2 to about 0.35, from about 0.2 to about 0.3, from about 0.25 to about 0.45, from about 0.25 to about 0.4, from about 0.25 to about 0.35, from about 0.25 to about 0.3, from about 0.3 to about 0.45, from about 0.3 to about 0.4, from about 0.3 to about 0.35, from about 0.35 to about 0.45, from about 0.35 to about 0.4, and from about 0.4 to about 0.45. Other embodiments include a stack adhesive 10*b* characterized by a Poisson's ratio of about 0.1, 0.15, 0.2, 0.25, 0.3, 0.35, 0.4, 0.45, 0.5, or any Poisson's ratio between these values. In one aspect, the Poisson's ratio of the stack adhesive 10*b* is from about 0.4 to about 0.5.

As outlined above, the foldable electronic device module 100*b* depicted in FIG. 2 can include a stack adhesive 10*b* with certain material properties (e.g., a shear modulus from about 10 kPa to about 100 kPa). Example adhesives that can be employed as the stack adhesive 10*b* in the module 100*b* are generally the same or similar to those suitable for the first adhesive 10*a*. Thus, the stack adhesive 10*b* can include OCAs, epoxies, and other joining materials as understood by those with ordinary skill in the field that are suitable to join the stack element 75 to the first primary surface 64 of the panel 60. In some aspects of the module 100*b*, the stack adhesive 10*b* will also possess a high thermal resistance such that its material properties experience little to no change upon being subjected to various temperatures and temperature gradients in the application environment, including those generated by friction from bending of the foldable electronic device module 100*b*.

Referring again to FIG. 2, the cover element 50 of the foldable electronic device module 100*b* is further characterized by a puncture resistance of at least 1.5 kgf when the first primary surface 54 of the cover element is loaded with a tungsten carbide ball having a diameter of 1.5 mm. Further, the device module 100*b* is characterized by a tangential stress at the second primary surface 56 of the cover element 50 of no greater than about 1000 MPa in tension upon bending the module in a two-point configuration to a bend radius from about 10 mm to about 3 mm such that the first primary surface 54 is in compression and the bend radius is measured from a center point above the first primary surface 54 of the cover element 50 to the second primary surface 66 of the panel 60 (see FIG. 4B). These performance characteristics associated with the foldable electronic device module 100*b* (FIG. 2) are comparable to those demonstrated by the foldable electronic device module 100*a* (FIG. 1). More particularly, these reduced tensile stress levels at the second primary surface 56 of the cover element 50 are achieved through tailoring of the material properties of the first adhesive 10*a* (e.g., shear modulus and/or Poisson's ratio) and/or the thickness 12*a* of the first adhesive 10*a*. Thus, some aspects of the disclosure provide a foldable electronic device module with improved mechanical reliability, particularly at its cover element, through the control of the material properties and/or thickness of the adhesive joining the cover element to the stack within the module.

Referring to FIG. 3, a foldable electronic device module 100*c* is provided with most of its features in common with the foldable electronic device module 100*b* (see FIG. 2), including performance characteristics (i.e., high puncture resistance and minimal tangential stresses (in tension) at the second primary surface of the cover element). Unless otherwise noted, any features in common between the modules 100*b* and 100*c* (i.e., with the same element numbers) have the same or similar construction, features and properties. As shown in FIG. 3, the module 100*c* also includes a cover element 50 having a thickness 52 from about 25 µm to about 200 µm and a cover element elastic modulus from about 20 GPa to about 140 GPa.

The module 100*c* depicted in FIG. 3 further includes: a stack 90*c* having a thickness 92*c* from about 100 µm to about 600 µm; and a first adhesive 10*a* configured to join the stack element 75*c* to the second primary surface 56 of the cover element 50. The stack 90c further includes a panel 60 having first and second primary surfaces 64, 66, and a panel elastic modulus from about 300 MPa to about 10 GPa. The stack 90c also includes one or more electronic devices 102 (e.g., touch sensor electrode lines, and other electronic device and electronic device components) coupled to the panel 60 or touch sensor 80 (e.g., as shown schematically in FIG. 3), and a stack element 75c having a stack element elastic modulus from about 1 GPa to about 5 GPa, with the stack element being affixed to the panel 60 with a stack adhesive 10b. It should also be understood that the relationship between the panel 60, stack element 75c and electronic devices 102 (e.g., as coupled to the touch sensor 80 depicted in FIG. 3) is depicted in exemplary, schematic form in FIG. 3. Depending on the application for the device module 100c, these elements may have different orientations with regard to one another. For example, panel 60 can be an LCD panel or an OLED display in which the electronic devices 102 are sandwiched within the panel 60 by two glass layers, or a polymeric substrate encapsulated by a glass sealing layer, for instance. See FIG. 2. In another example (as depicted in FIG. 3), the electronic devices 102 can be aspects of a touch sensor (e.g., electronic trace lines in a transparent conductor such as indium tin oxide, silver nanowires, etc.) located at a higher vertical position within the stack 75c, above the panel 60 and stack adhesive 10b, and coupled to the sensor 80. Depending on the application for the module 100c, it is also envisioned that some electronic devices 102 could be located within or on panel 60 and others coupled to touch sensor 80.

In some aspects of the module 100c depicted in FIG. 3, the stack element 75c exhibits a stack element elastic modulus from about 1 GPa to about 5 GPa, for example, from about 1 GPa to about 4.5 GPa, from about 1 GPa to about 4 GPa, from about 1 GPa to about 3.5 GPa, from about 1 GPa to about 3 GPa, from about 1 GPa to about 2.5 GPa, from about 1 GPa to about 2 GPa, from about 1 GPa to about 1.5 GPa, from about 1.5 GPa to about 4.5 GPa, from about 1.5 GPa to about 4 GPa, from about 1.5 GPa to about 3.5 GPa, from about 1.5 GPa to about 3 GPa, from about 1.5 GPa to about 2.5 GPa, from about 1.5 GPa to about 2 GPa, from about 2 GPa to about 4.5 GPa, from about 2 GPa to about 4 GPa, from about 2 GPa to about 3.5 GPa, from about 2 GPa to about 3 GPa, from about 2 GPa to about 2.5 GPa, from about 2.5 GPa to about 4.5 GPa, from about 2.5 GPa to about 4 GPa, from about 2.5 GPa to about 3.5 GPa, from about 2.5 GPa to about 3 GPa, from about 3 GPa to about 4.5 GPa, from about 3 GPa to about 4 GPa, from about 3 GPa to about 3.5 GPa, from about 3.5 GPa to about 4.5 GPa, from about 3.5 GPa to about 4 GPa, and from about 4 GPa to about 4.5 GPa.

In the foldable electronic device module 100c depicted in FIG. 3, the stack element 75c includes a touch sensor 80, a polarizer 70, and an adhesive 10c that joins the touch sensor 80 to the polarizer 70. In general, the composition and thickness of the adhesive 10c is comparable to those employed in the first adhesive 10a and the stack adhesive 10b. To the extent that the adhesives 10a and 10b possess different material properties and/or thicknesses, the adhesive 10c can be selected to match the properties and/or thicknesses of the first adhesive 10a or stack adhesive 10b.

Still referring to FIG. 3, certain aspects of the foldable module 100c can be configured to minimize bending forces associated with bending the entire module by controlling the shear modulus of one or more of the adhesives employed within the module 100c. More particularly, the use of a first adhesive 10a, stack adhesive 10b and/or an adhesive 10c with a relatively lower shear modulus value (e.g., 0.01 MPa to 0.1 MPa) can unexpectedly reduce the overall bending force required to fold or otherwise bend the entire module 100c in an upward or downward direction such that the first primary surface 54 exhibits a concave or convex shape, respectively. These bending force reductions associated with certain aspects of the foldable module 100c through the use of a first adhesive 10a, stack adhesive 10b and/or adhesive 10c with a relatively low elastic shear modulus value are obtained relative to a foldable module (e.g., foldable module 100c) with one or more adhesives (e.g., adhesives 10a, 10b and 10c) having a shear modulus that exceeds 0.1 MPa. Further, certain aspects of the foldable module 100c can be configured to minimize bending forces associated with bending the entire module by controlling the thickness of the first adhesive 10a, stack adhesive 10b and/or adhesive 10c. More particularly, the use of a first adhesive 10a with a range of thicknesses 12a (e.g., from about 10 μm to about 40 μm), stack adhesive 10b with a range of thicknesses 12b (e.g., from about 10 μm to about 40 μm) and/or adhesive 10c with a range of thicknesses (e.g., from about 10 μm to 40 μm) can reduce the overall bending force required to fold or otherwise bend the entire module 100c in an upward or downward direction such that the first primary surface 54 exhibits a concave or convex shape, respectively. These bending force reductions associated with certain aspects of the foldable module 100c through the use of a first adhesive 10a, stack adhesive 10b and/or adhesive 10c within a prescribed range of thicknesses are obtained relative to a foldable module (e.g., foldable module 100c) with one or more adhesives (e.g., first adhesive 10a, stack adhesive 10b and/or adhesive 10c) having a relatively small thickness (e.g. less than 10 μm) or a relatively large thickness (e.g., more than 40 μm).

Referring again to FIG. 3, the foldable electronic device module 100c can be characterized by a bending force ($F_{bend}$) of no greater than 150 Newtons (N) as the module is bent inward by a test apparatus to a bend radius 220, the bend radius being approximately half the distance (D) between two test plates 250 (see FIGS. 4A & 4B). In certain implementations, the bending force is no greater than about 150 N, 140 N, 130 N, 120 N, 110 N, 100 N, 90 N, 80 N, 70 N, 60 N, 50 N, 40 N, 30 N, 20 N, 10 N, 5 N, or any amount between these bending force upper limits, upon bending of the module to a radius from about 20 mm to about 3 mm (i.e., a plate distance (D) of about 40 to about 6 mm), for example, 20 mm, 19.75 mm, 19.5 mm, 19.25 mm, 19 mm, 18.5 mm, 17.5 mm, 17 mm, 16.5 mm, 16 mm, 15.5 mm, 15 mm, 14.5 mm, 14 mm, 13.5 mm, and 13 mm, 12.5 mm, 12 mm, 11.5 mm, 11 mm, 10.5 mm, 10 mm, 9.5 mm, 9 mm, 8.5 mm, 7.5 mm, 7 mm, 6.5 mm, 6 mm, 5.5 mm, 5 mm, 4.5 mm, 4 mm, 3.5 mm, 3.25 mm and 3 mm. As outlined earlier, these relatively low bending forces can be obtained in the foldable electronic device module 100c through tailoring of the material properties and/or thicknesses of the first adhesive 10a, stack adhesive 10b and/or adhesive 10c.

As also depicted in FIG. 3, the foldable electronic device module 100c containing three adhesives and multiple layers exhibits performance characteristics comparable to those demonstrated by the foldable modules 100a and 100b (see FIGS. 1 and 2). In particular, reduced tensile stress levels at the second primary surface 56 of the cover element 50 are achieved through tailoring of the material properties of the first adhesive 10a (e.g., shear modulus and/or Poisson's ratio) and/or the thickness 12a (see FIG. 2) of the first adhesive 10a. In general, the disclosure provides a foldable electronic device module 100c with improved mechanical reliability, particularly at its cover element through the control of the material properties and/or thickness of the adhesive joining the cover element to the stack within the module. The foldable electronic device module 100c also demonstrates high mechanical reliability indicative of low tensile stresses at the first primary surface 64 of the panel 60 through the control of the material properties and/or thickness of the stack adhesive 10b joining the panel to the stack element 75c.

Referring to FIGS. 4A & 4B, the foldable electronic device modules 100a-c (see FIGS. 1-3) are depicted in an un-bent and a bent configuration, respectively, within a two-point test apparatus 200 according to an aspect of the disclosure. It should be understood that some of the features associated with the foldable electronic device modules 100a-c are not depicted in FIGS. 4A and 4B for purposes of clarity.

In FIG. 4A, the modules 100a-c are depicted in an un-bent configuration within the two-point test apparatus 200 (see FIG. 4B, showing the test apparatus 200). Two vertical plates 250 are pressed inward against the module 100a, 100b or 100c during a bending test with a constant force, $F_{bend}$. Fixtures (not shown) associated with the test apparatus 200 ensure that the modules are bent in an upward direction as the $F_{bend}$ forces are applied to the modules via the plates 250.

Referring to FIG. 4B, the plates 250 are moved together in unison until a particular bend radius 220 is achieved. In general, the bend radius 220 is about half the distance, D, between the plates 250. As outlined earlier, the foldable electronic device modules 100a-c are characterized by a tangential stress at the second primary surface 56 (see FIGS. 1-3) of the cover element 50 of no greater than 1000 MPa in tension (i.e., at point "T") upon bending the module in a two-point apparatus 200 to a bend radius 220 from about 20 mm to about 2 mm such that the first primary surface 54 is in compression (i.e., at point "C"). As shown in FIG. 4B, the bend radius 220 is measured from a center point above the first primary surface 54 of the cover element 50 to the second primary surface 66 of the panel 60. This center point is located on a line of symmetry 210 associated with the modules 100a-c. In certain implementations, the tangential stress (in tension) at the second primary surface 56 (see FIGS. 1-3) of the cover element 50 is no greater than about 1000 MPa, 950 MPa, 925 MPa, 900 MPa, 875 MPa, 850 MPa, 825 MPa, 800 MPa, 775 MPa, 750 MPa, 725 MPa, 700 MPa, or any amount between these tangential stress limits (in tension). Further, in other implementations of the disclosure, the modules 100a, 100b and 100c, can be characterized by a bending force ($F_{bend}$) of no greater than 150 Newtons (N) as the module is bent inward by the test apparatus 220 employing plates 250 (see FIGS. 4A & 4B). In certain implementations, the bending force is no greater than about 150 N, 140 N, 130 N, 120 N, 110 N, 100 N, 90 N, 80 N, 70 N, 60 N, 50 N, 40 N, 30 N, 20 N, 10 N, 5 N, or any amount between these bending force upper limits, upon bending of the module to a radius from about 20 mm to about 3 mm (i.e., a plate distance (D) of about 40 to about 6 mm).

Through careful study and analysis of foldable modules comparable in configuration to the foldable modules 100a, 100b and 100c, an understanding of the importance of controlling the material properties and/or thicknesses of the adhesives employed within the modules was developed. These studies included the development of simple two-layer models based on conventional composite beam theory and equations, with one layer corresponding to the cover element and the other layer corresponding to a stack (e.g., as envisioned to include a panel, electronic devices and other components). In addition, more sophisticated non-linear finite element analysis ("FEA") models (i.e., employing conventional FEA software packages) contributed to aspects of the disclosure. In particular, the FEA models were used to simultaneously assess stresses that could lead to cohesive failures of the cover element, delamination effects, and potential buckling issues within the foldable modules.

Figure 5A:
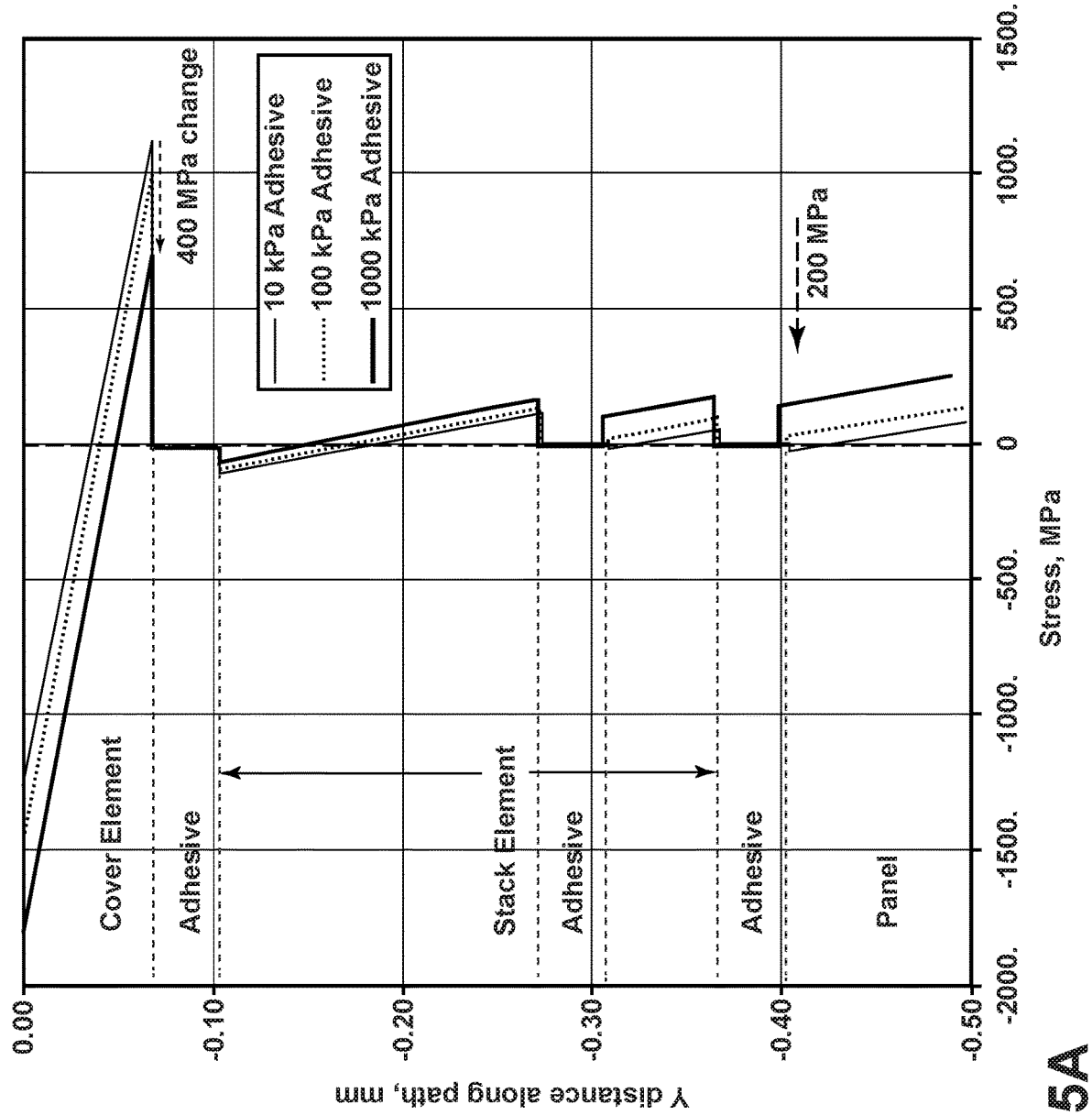
FIG. 5A is a plot of estimated tangential stress as a function of depth through the thickness of three foldable electronic device modules, each containing a first adhesive with a different shear modulus configured to join a cover element to a stack, according to a further aspect of the disclosure.
Figure 5B:
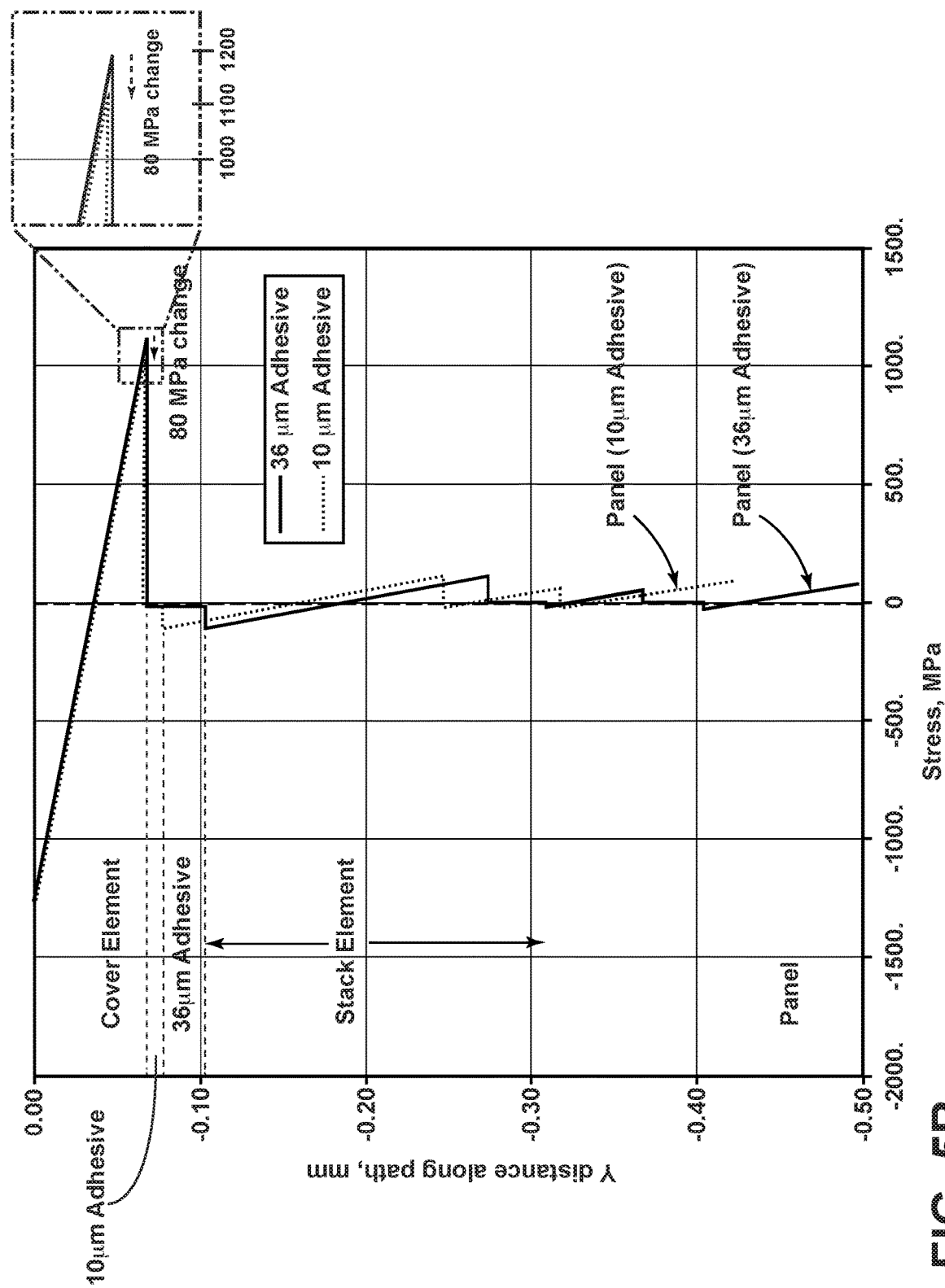
FIG. 5B is a plot of estimated tangential stress as a function of depth through the thickness of two foldable electronic device modules, each containing a first adhesive with a different thickness configured to join a cover element to a stack with a different thickness, according to another aspect of the disclosure.
Figure 6:
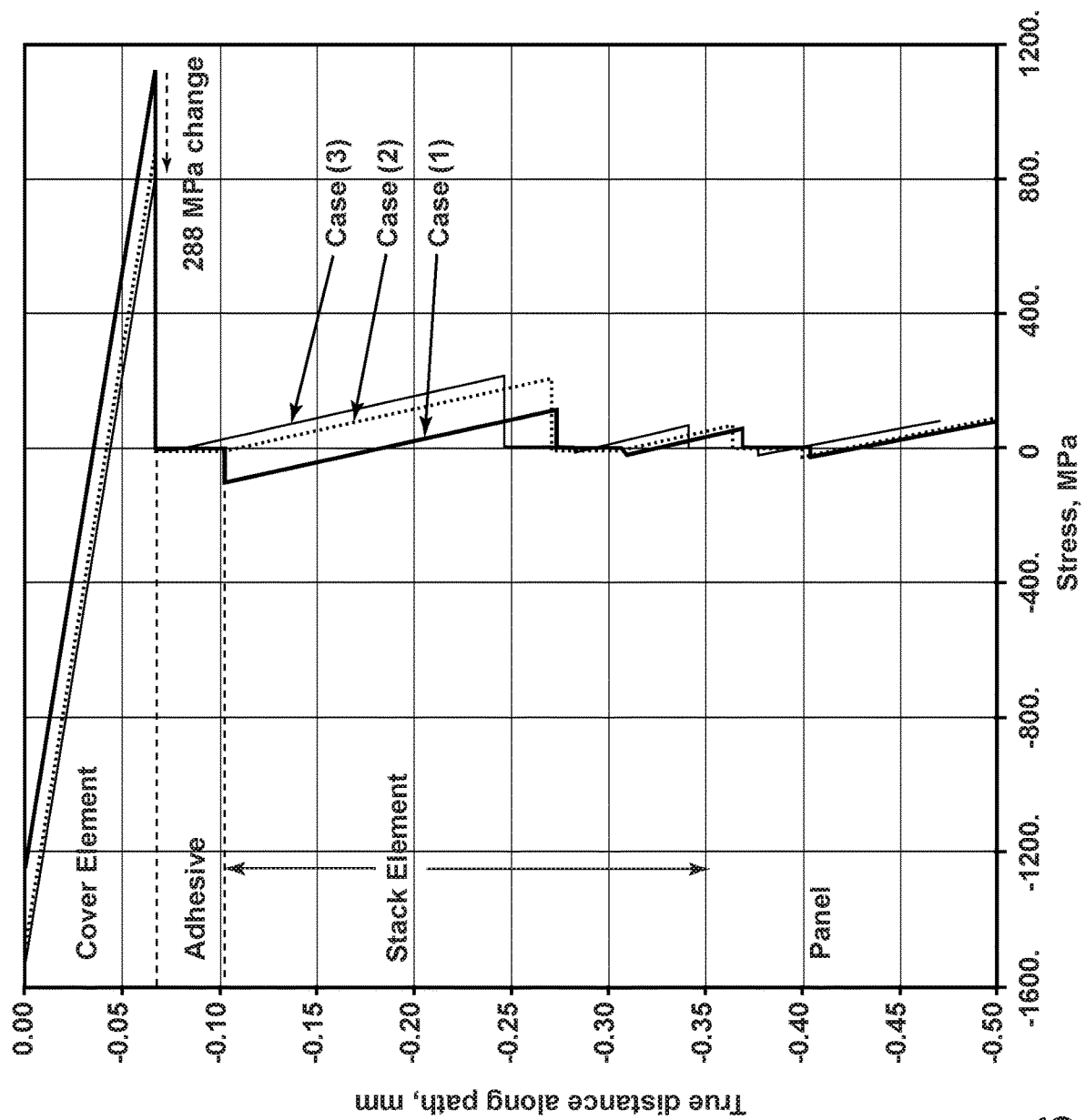
FIG. 6 is a plot of estimated tangential stress as a function of depth through the thickness of three foldable electronic device modules having different adhesive configurations, according to a further aspect of the disclosure.

The output of these non-linear FEA models included the plots depicted in FIGS. 5A, 5B and 6. Each of these figures includes a plot of estimated tangential stress (MPa) as a function of depth (mm) through the thickness of foldable electronic device modules comparable in design to the modules contained in the disclosure, e.g., modules 100a-c. The foldable electronic device modules were subjected to a bend radius of 3 mm (e.g., bend radius 220, as shown in FIG. 4B) within the FEA model. Table 1 below provides a listing of elements employed in the FEA model, including assumed material properties for each of them. Further, the FEA model was conducted with the following additional assumptions: (a) the entire module was assumed to have a non-linear geometric response; (b) the adhesives were assumed to be incompressible, hyper-elastic materials; (c) the cover elements and other non-adhesive features in the model were assumed to have elastic material properties; and (d) the bending was conducted at room temperature.

TABLE ONE

| Element | Thickness (μm) | Elastic modulus, E (GPa) | Poisson's ratio, ν |
|---|---|---|---|
| Glass cover element | 67 | 71 | 0.22 |
| Touch sensor - PET | 170 | 2.8 | 0.37 |
| Polarizer - PET | 60 | 2.8 | 0.37 |
| Panel - polyimide | 95 | 2.5 | 0.34 |
| Adhesive | Variable (10 to 36) | Variable (shear modulus) | 0.499 |

Referring to FIG. 5A, a plot of estimated tangential stress as a function of depth through the thickness of three foldable electronic device modules is provided. In this plot, each of the three bendable modules contains adhesives (e.g., comparable to first adhesive 10a and stack adhesive 10b employed in the bendable module 100c shown in FIG. 3) configured to join a cover element to a stack, and a stack to a panel, each with a different shear modulus, 10 kPa, 100 kPa and 1000 kPa, respectively. In particular, each of the adhesives employed in a given module was assumed to possess the same shear modulus, 10 kPa, 100 kPa or 1000 kPa. As the plot makes clear, the tangential stresses observed at the interface between the cover element and the first adhesive (e.g., at the second primary surface 56 of the cover element 50) are reduced by about 400 MPa (in tension) with an increase in the shear modulus of the adhesives contained in the module from 10 kPa to 1000 kPa. That is, FIG. 5A demonstrates that increasing the shear modulus of all of the adhesives within a given bendable electronic device module can beneficially reduce the tensile stresses at the second primary surface of the cover element.

Also referring to FIG. 5A, the tensile stresses observed at the interface between the panel and an adhesive joining the panel to a stack element (e.g., stack adhesive 10b employed in the foldable module 100c shown in FIG. 3) are reduced by about 200 MPa with a decrease in the shear modulus of the adhesives contained in the module from 1000 kPa to 10 kPa. That is, FIG. 5A demonstrates that decreasing the shear modulus of all of the adhesives within a given bendable electronic device module can beneficially reduce the tensile stresses at the first primary surface of the panel employed in the device module.

Referring to FIG. 5B, a plot of estimated tangential stress as a function of depth through the thickness of two foldable electronic device modules is provided. In this plot, each of the bendable modules contain adhesives (e.g., comparable to first adhesive 10a and stack adhesive 10b employed in the bendable module 100c shown in FIG. 3) configured to join a cover element to a stack, and to join a stack to a panel, with a shear modulus of 10 kPa. In one of the modules, the thickness of each of the adhesives employed in the module was set at 10 µm. In the other module, the thickness of each of the adhesives employed in the module was set at 36 µm. As the plot makes clear, the tensile stresses observed at the interface between the cover element and the first adhesive (e.g., at the second primary surface 56 of the cover element 50) are reduced by about 80 MPa with a decrease in the thickness of the adhesives contained in the module from 36 µm to 10 µm. That is, FIG. 5B demonstrates that decreasing the thickness of all of the adhesives within a given bendable electronic device module can beneficially reduce the tensile stresses at the second primary surface of the cover element.

Referring to FIG. 6, a plot of estimated tangential stress as a function of depth through the thickness of three foldable electronic device modules is provided. In this plot, "Case (1)" corresponds to a bendable module with all of its adhesives exhibiting a shear modulus of 10 kPa and having a thickness of 36 µm. "Case (2)" corresponds to a bendable module with the same configuration as Case (1), except that the shear modulus of the adhesive adjacent to the cover element was increased to 1000 kPa. "Case (3)" corresponds to a bendable module with the same configuration as Case (2), except that the thickness of the adhesive adjacent to the cover element is reduced to 12 µm. As the plot makes clear, the tensile stresses observed at the interface between the cover element and the first adhesive (e.g., at the second primary surface 56 of the cover element 50) are reduced by about 240 MPa with an increase in the shear modulus of the first adhesive adjacent to the cover element from 10 kPa to 1000 kPa (i.e., from Case (1) to Case (2)). Further, another 48 MPa reduction in tensile stress is observed with a decrease in the thickness of the first adhesive adjacent to the cover element from 36 µm to 12 µm (i.e., from Case (2) to Case (3)). That is, FIG. 6 demonstrates that decreasing the thickness and increasing the shear modulus of the adhesive joining the cover element to the stack within a given bendable electronic device module can beneficially reduce the tensile stresses at the second primary surface of the cover element.

Figure 7:
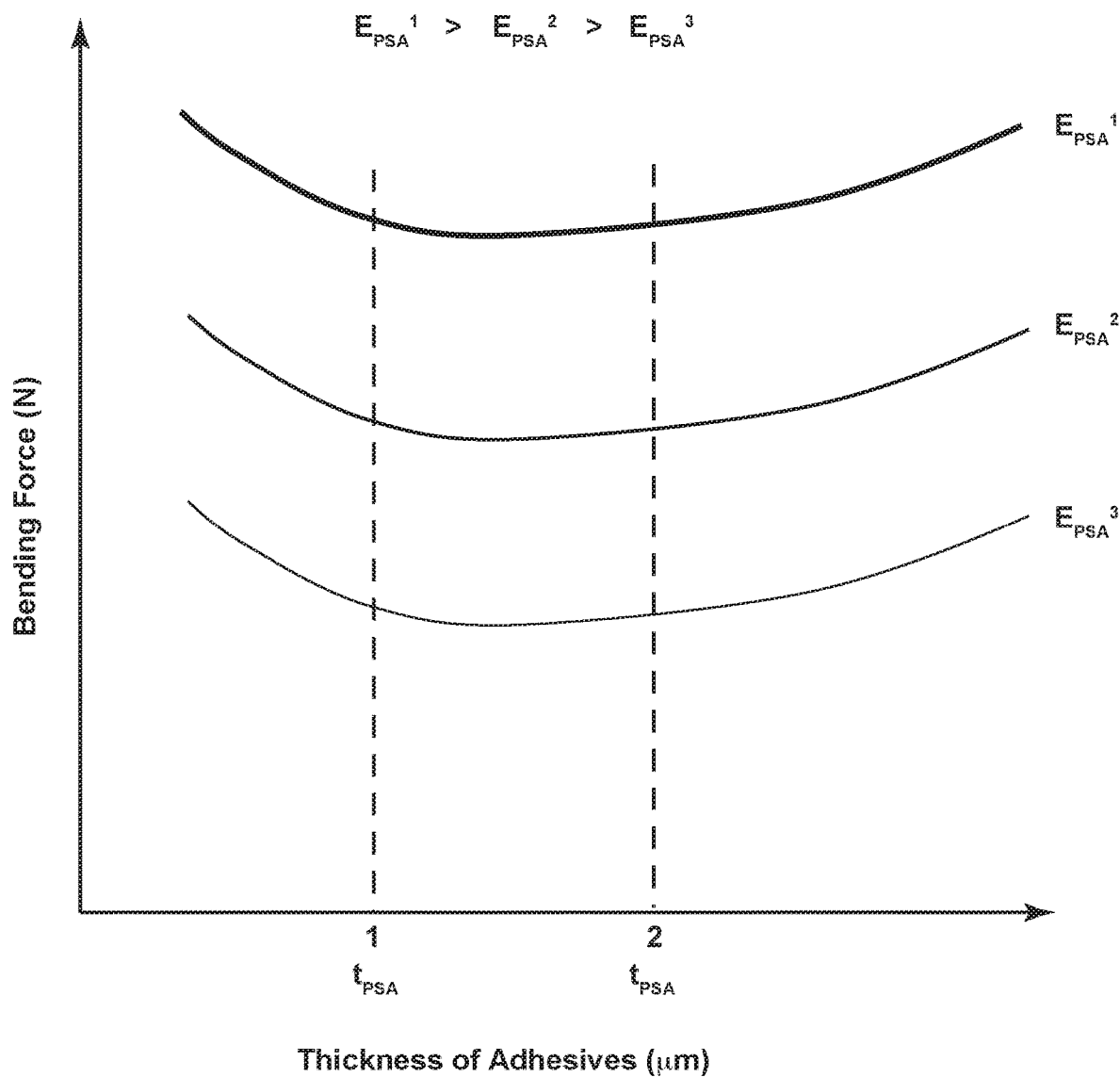
FIG. 7 is a schematic plot of estimated bending force as a function of adhesive thickness for three foldable electronic device modules, each configured with adhesives having a distinct shear modulus, according to a further aspect of the disclosure.

Referring to FIG. 7, a schematic plot of estimated bending force (N) as a function of adhesive thickness (µm) is provided for three foldable electronic device modules configured in an arrangement comparable to modules 100c. More particularly, each of the three modules is configured with three adhesives (e.g., a first adhesive 10a, a stack adhesive 10b and an adhesive 10c). Further, the three adhesives in each of the modules all have a single, distinct shear modulus; consequently, the adhesives in the first module have a shear modulus of "$E_{PSA}^1$," the adhesives in the second module have a shear modulus of "$E_{PSA}^2$" and the adhesives in the third module have a shear modulus of "$E_{PSA}^3$." As shown in FIG. 7, $E_{PSA}^1 > E_{PSA}^2 > E_{PSA}^3$. It is evident from FIG. 7 that a reduction in the shear modulus of the adhesives employed in these foldable electronic device modules results in a significant decrease in the bending forces required to fold or otherwise bend these modules (e.g., as in a two-point test configuration depicted in FIGS. 4A & 4B). It is also apparent from FIG. 7 that optimum reductions in bending forces (N) occur for these electronic device modules for a certain range of thicknesses, i.e., between "$t_{PSA}^1$" and "$t_{PSA}^2$." Some aspects of the electronic device modules exhibit their lowest bending forces in a thickness range from about 10 µm to about 30 µm, corresponding to respective $t_{PSA}^1$ and $t_{PSA}^2$ thicknesses, as depicted in FIG. 7. In contrast, adhesive thicknesses (µm) greater than $t_{PSA}^2$ and thicknesses lower than $t_{PSA}^1$ tend to result in increasing bending forces.

Figure 8A:
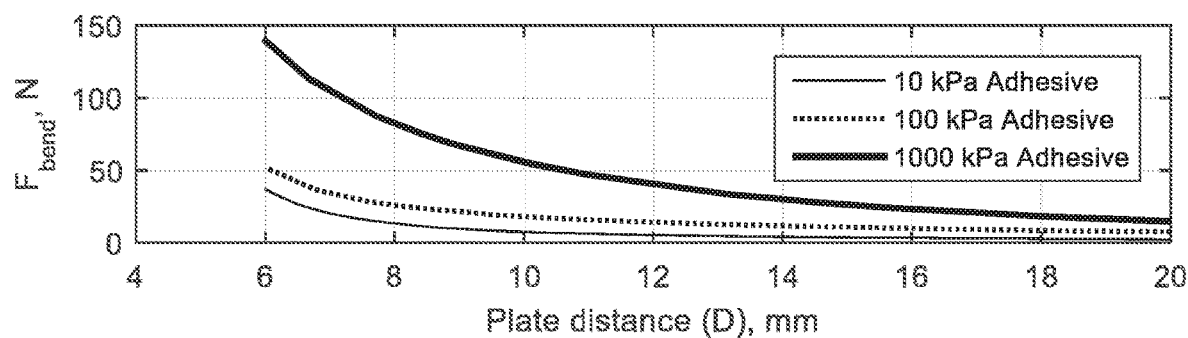
FIGS. 8A-8C are plots of estimated bending force as a function of plate distance in a two-point test apparatus for the foldable electronic device modules depicted in FIGS. 5A, 5B and 6, respectively, according to another aspect of the disclosure.

Referring to FIG. 8A, a plot of estimated bending force, $F_{bend}$ (N), as a function of plate distance, D (mm), in a two-point test apparatus is provided for the foldable electronic device modules depicted in FIG. 5A. That is, each of the three bendable modules depicted in FIG. 8A contains adhesives (e.g., comparable to first adhesive 10a, stack adhesive 10b and adhesive 10c employed in the bendable module 100c shown in FIG. 3) configured to join a cover element to a stack, and a stack to a panel, each with a different shear modulus, 10 kPa, 100 kPa and 1000 kPa, respectively. In particular, each of the adhesives employed in a given module was assumed to possess the same shear modulus, 10 kPa, 100 kPa or 1000 kPa. As shown in FIG. 8A, the bending force for a module as a function of plate distance is sensitive to the shear modulus of the adhesives employed within the module. For example, at a plate distance of 6 mm (i.e., bend radius of about 3 mm), the device module with adhesives exhibiting a shear modulus of 1000 kPa experienced a bending force of about 140 N and the device module with adhesives exhibiting a shear modulus of 10 kPa experienced a bending force of about 30N. Accordingly, foldable electronic device modules can be optimized to reduce bending forces by employing adhesives with a relatively low shear modulus. Depending on the application for the module, however, any reduction in bending force through control of adhesive shear modulus can be offset or otherwise optimized in view of the decreases in tangential stress between the cover element and first adhesive that can be obtained through increasing the shear modulus of the adhesives within the module, as outlined earlier in connection with FIG. 5A.

Figure 8B:
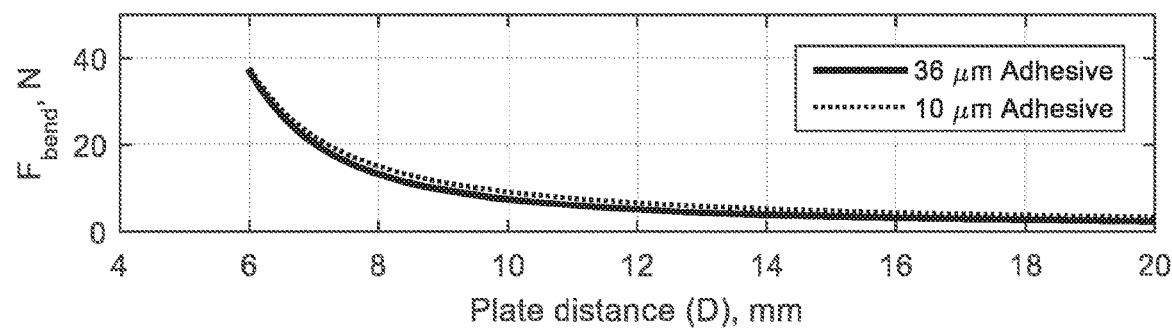

Referring to FIG. 8B, a plot of estimated bending force, $F_{bend}$ (N), as a function of plate distance, D (mm), in a two-point test apparatus is provided for the two foldable electronic device modules depicted in FIG. 5B. That is, each of the bendable modules contain adhesives (e.g., comparable to first adhesive 10a, stack adhesive 10b and adhesive 10c employed in the bendable module 100c shown in FIG. 3) configured to join a cover element to a stack, and to join a stack to a panel, with a shear modulus of 10 kPa. In one of the modules, the thickness of each of the adhesives employed in the module was set at 10 µm. In the other module, the thickness of each of the adhesives employed in the module was set at 36 µm. As shown in FIG. 8B, the bending force for a module as a function of plate distance is fairly insensitive to the thickness of the adhesives employed within the module when the thickness is between about 10 µm and about 36 µm. For example, at a plate distance of 6 mm (i.e., bend radius of about 3 mm), both device modules experienced about the same bending force, between about 35 N and about 40 N. Nevertheless, it is also evident from FIG. 7 that adhesive thickness levels farther above 36 µm and below 10 µm can lead to increasing amounts of bending forces experienced by the modules.

Figure 8C:
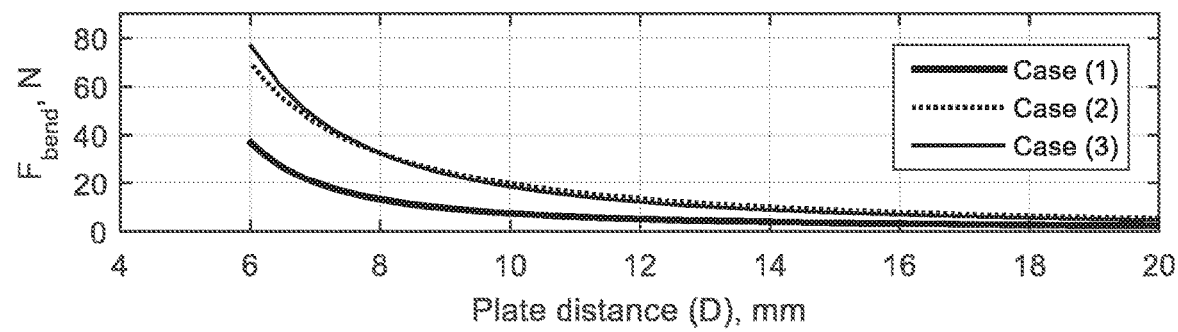

Referring to FIG. 8C, a plot of estimated bending force, $F_{bend}$ (N), as a function of plate distance, D (mm), in a two-point test apparatus for the three foldable electronic device modules depicted in FIG. 6. As noted earlier, "Case (1)" corresponds to a bendable module with all of its adhesives exhibiting a shear modulus of 10 kPa and having a thickness of 36 µm. "Case (2)" corresponds to a bendable module with the same configuration as Case (1), except that the shear modulus of the adhesive adjacent to the cover element was increased to 1000 kPa. Hence, in Case (2) the shear modulus values of the other adhesives in the module not adjacent to the cover element are set at 10 kPa. "Case (3)" corresponds to a bendable module with the same configuration as Case (2), except that the thickness of the adhesive adjacent to the cover element is reduced to 12 µm. That is, in Case (3) the thicknesses of the other adhesives in the module not adjacent to the cover element are set at 36 µm and the adhesive adjacent to the cover element had a shear modulus of 1000 kPa, and a thickness of 12 µm.

As shown in FIG. 8C, the bending force for a plate distance of 6 mm is at a minimum for Case (1) at about 40 N, which corresponds to an electronic module with all of its adhesives having a thickness of 36 µm and a shear modulus of 10 kPa. For the Case (3) condition, however, a modest increase in bending force of about 40 N is realized by adjusting the thickness and shear modulus of the first adhesive (i.e., without any change to the shear modulus or thickness of the other adhesives in the module) to 12 µm and 1000 kPa, respectively. The Case (3) condition with a modest increase of about 40 N in the bending force stands in contrast to the approximate 110 N increase in bending force that results from increasing the shear modulus of all of the adhesives in the module as shown in FIG. 8A. Moreover, as demonstrated earlier in FIG. 6, the Case (3) condition is particularly advantageous in providing a 288 MPa reduction in tangential stress between the glass cover element and the first adhesive. Hence, a significant decrease in tangential stress can be realized in the module by increasing the shear modulus and reducing the thickness of the first adhesive, i.e., the adhesive adjacent to the glass cover element, with only modest increases to the bending force.

Advantageously, the foldable electronic device modules in the disclosure are configured for high mechanical reliability and puncture resistance. In particular, these foldable modules exhibit reduced tangential stresses (in tension) at primary surfaces of the cover element and/or panel through control of the material properties and/or thicknesses of the adhesives employed in the modules. These lower tensile stresses translate into better reliability and/or smaller bend radius capability. Moreover, these lower tensile stresses can provide an improved design margin for electronic devices employing these foldable modules. In view of the reductions of tensile stress in the foldable modules associated with aspects of the disclosure, the need for compressive stress regions and/or other strength-enhancing measures that produce high, residual compressive stresses in the cover element can be reduced. Accordingly, compressive stress region-related processing costs associated with the cover element can be reduced in view of the concepts set forth in the disclosure. Further, the beneficial effects of reducing the thickness of the first adhesive in these bendable modules in terms of tensile stress reductions can additionally provide an overall reduction in the thickness of the module. Such module thickness reductions can be advantageous for many end product applications for these modules having a low profile.

Also advantageously, the foldable electronic device modules in the disclosure can be configured to minimize the bending forces required of the user to bend or otherwise fold the module. In particular, bending forces experienced by these modules can be reduced by decreasing the shear modulus and/or optimizing the thickness of the adhesives employed in the module. Further, certain exemplary foldable electronic device modules can be optimized for mechanical reliability, puncture resistance and bend force reductions by utilizing a relatively high shear modulus adhesive at the glass cover element and relatively low shear modulus adhesives in other locations within the module.

It will be apparent to those skilled in the art that various modifications and variations can be made to the foldable electronic device modules of the disclosure without departing from the spirit or scope of the claims.

What is claimed is:

1. A foldable electronic device module, comprising:
 a cover element comprising:
  (a) a component having a glass composition, and a component having a polymer composition,
  (b) a first primary surface, and
  (c) a second primary surface;
 a stack comprising:
  (a) a panel having a first primary surface and a second primary surface, the first primary surface facing the second primary surface of the cover element, and a panel elastic modulus between about 300 MPa and about 10 GPa, and
  (b) an electronic device coupled to the panel; and
 a first adhesive configured to join the stack to the second primary surface of the cover element, the first adhesive comprising a shear modulus between about 0.1 MPa and about 100 MPa,
 wherein a thickness measured between second primary surface of the cover element and the second primary surface of the panel is from about 105 µm to about 660 µm, the glass component of the cover element comprises a compressive stress region comprising a compressive stress from about 100 MPa to about 2,000 MPa at the first primary surface of the cover element.

2. The foldable electronic device module of claim 1, wherein the first adhesive has a thickness from about 5 µm to about 60 µm.

3. The foldable electronic device module of claim 1, wherein the first adhesive has a thickness from about 10 µm to about 36 µm.

4. The foldable electronic device module of claim 1, wherein the first adhesive has a Poisson's ratio of 0.1 to 0.5.

5. The module of claim 1, wherein the device module is further characterized by a bending force of no more than about 150 N upon bending the module in a two-point configuration to a bend radius of about 3 mm such that the first primary surface is in compression and the bend radius is measured from a center point above the first primary surface of the cover element to the second primary surface of the panel.

6. The foldable electronic device module of claim 1, wherein the panel comprises an OLED.

7. The foldable electronic device module of claim 1, wherein the cover element is able to withstand a bend radius of from 5 mm to 7 mm for 60 minutes in an environment of about 25° C. and about 50% relative humidity.

8. The foldable electronic module of claim 1, wherein the glass component of the cover element has an elastic modulus from about 50 GPa to about 100 GPa.

9. A foldable electronic device module, comprising:
 a cover element comprising:
  (a) a component having a glass composition, and a component having a polymer composition, (b) a first primary surface, and
(c) a second primary surface;
a stack comprising:
(a) a panel having a first primary surface and a second primary surface, and a panel elastic modulus between about 300 MPa and about 10 GPa,
(b) an electronic device coupled to the panel, and
(c) a stack element having a stack element elastic modulus between about 1 GPa and about 105 GPa, the stack element affixed to the first primary surface of the panel with a stack adhesive; and
a first adhesive joining the stack element to the second primary surface of the cover element, the first adhesive comprising a shear modulus between about 1 MPa and about 1 GPa,
wherein a thickness measured between second primary surface of the cover element and the second primary surface of the panel is from about 105 μm to about 660 μm, the glass component of the cover element comprises a compressive stress region comprising a compressive stress from about 100 MPa to about 2,000 MPa at the first primary surface of the cover element.

10. The foldable electronic device module of claim 9, wherein the glass component of the cover element has an elastic modulus from about 50 GPa to about 100 GPa.

11. The foldable electronic device module of claim 9, wherein the first adhesive comprises a shear modulus between about 1 MPa and about 100 MPa.

12. The foldable electronic device module of claim 11, wherein the first adhesive comprises a thickness from about 10 μm to about 20 μm.

13. The foldable electronic device module of claim 9, wherein the first adhesive comprises a thickness from about 5 μm to about 60 μm.

14. The foldable electronic device module of claim 9, wherein the first adhesive further comprises a Poisson's ratio from about 0.1 to about 0.25.

15. The foldable electronic device module of claim 9, wherein the stack adhesive comprises a shear modulus between about 10 kPa and about 100 kPa.

16. The foldable electronic device module of claim 9, wherein the stack adhesive comprises a thickness from about 5 μm to about 60 μm.

17. The foldable electronic device module of claim 9, wherein the stack adhesive comprises a thickness from about 30 μm to about 60 μm.

18. The foldable electronic device module of claim 9, wherein the stack adhesive comprises a Poisson's ratio from about 0.4 to about 0.5.

19. The foldable electronic device module of claim 9, wherein the device module is further characterized by a bending force of no more than about 150 N upon bending the module in a two-point configuration to a bend radius of about 3 mm such that the first primary surface is in compression and the bend radius is measured from a center point above the first primary surface of the cover element to the second primary surface of the panel.

20. The foldable electronic device module of claim 1, wherein the component of the cover element comprising the glass composition comprises a glass layer at the first primary surface of the cover element.

* * * * *

UNITED STATES PATENT AND TRADEMARK OFFICE
CERTIFICATE OF CORRECTION

PATENT NO. : 11,031,574 B2
APPLICATION NO. : 16/122009
DATED : June 8, 2021
INVENTOR(S) : Guangli Hu et al.

It is certified that error appears in the above-identified patent and that said Letters Patent is hereby corrected as shown below:

On the Title Page

On page 2, in Column 2, item (56), Foreign Patent Documents, Line 6, delete "20151116649" and insert -- 2015/116649 --, therefor.

On page 2, in Column 2, item (56), Other Publications, Line 16, delete "CN2016800598341" and insert -- CN201680059834.7 --, therefor.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*